United States Patent
Takashima et al.

(10) Patent No.: US 7,397,686 B2
(45) Date of Patent: Jul. 8, 2008

(54) MEMORY SYSTEM COMBINING FLASH EEPROM AND FERAM

(75) Inventors: Daisaburo Takashima, Yokohama (JP); Shuso Fujii, Kawasaki (JP); Takaya Suda, Kamakura (JP); Hiroshi Sukegawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 17 days.

(21) Appl. No.: 11/443,388

(22) Filed: May 31, 2006

(65) Prior Publication Data
US 2006/0274566 A1 Dec. 7, 2006

(30) Foreign Application Priority Data
Jun. 2, 2005 (JP) ............................. 2005-162795

(51) Int. Cl.
G11C 11/22 (2006.01)
G11C 16/04 (2006.01)
G06F 12/00 (2006.01)

(52) U.S. Cl. .................... 365/145; 365/185.33; 711/103

(58) Field of Classification Search .................. 365/145
See application file for complete search history.

(56) References Cited

U.S. PATENT DOCUMENTS

| | | | |
|---|---|---|---|
| 6,484,270 B1 * | 11/2002 | Odani | 714/6 |
| 6,772,233 B2 * | 8/2004 | Iida et al. | 710/13 |
| 7,103,718 B2 * | 9/2006 | Nickel et al. | 711/115 |
| 7,193,923 B2 * | 3/2007 | Nishihara et al. | 365/230.03 |
| 7,248,493 B2 * | 7/2007 | Takashima et al. | 365/145 |
| 2005/0041453 A1 * | 2/2005 | Brazis et al. | 365/63 |
| 2005/0050261 A1 * | 3/2005 | Roehr et al. | 711/103 |
| 2006/0087893 A1 * | 4/2006 | Nishihara et al. | 365/189.01 |
| 2006/0274565 A1 * | 12/2006 | Takashima et al. | 365/145 |
| 2007/0016719 A1 * | 1/2007 | Ono et al. | 711/103 |
| 2007/0162699 A1 * | 7/2007 | Sohn et al. | 711/115 |

FOREIGN PATENT DOCUMENTS

| | | |
|---|---|---|
| JP | 10-255483 | 9/1998 |
| JP | 11-177036 | 7/1999 |
| JP | 2000-22010 | 1/2000 |
| JP | 2005-209324 | 8/2005 |

\* cited by examiner

*Primary Examiner*—Son L Mai
(74) *Attorney, Agent, or Firm*—Oblon, Spivak, McClelland, Maier & Neustadt, P.C.

(57) ABSTRACT

A memory system includes a ferroelectric memory formed by arranging a plurality of memory cells having a ferroelectric capacitor and cell transistor, a flash EEPROM formed by arranging a plurality of memory cells having a floating gate and capable of electrically erasing and writing data, a control circuit configured to control the ferroelectric memory and flash EEPROM, and an interface circuit configured to communicate with the outside. The flash EEPROM stores data. The ferroelectric memory stores at least one of root information for storing the data, directory information, the file name of the data, the file size of the data, file allocation table information storing the storage location of the data, and the write completion time of the data.

12 Claims, 22 Drawing Sheets

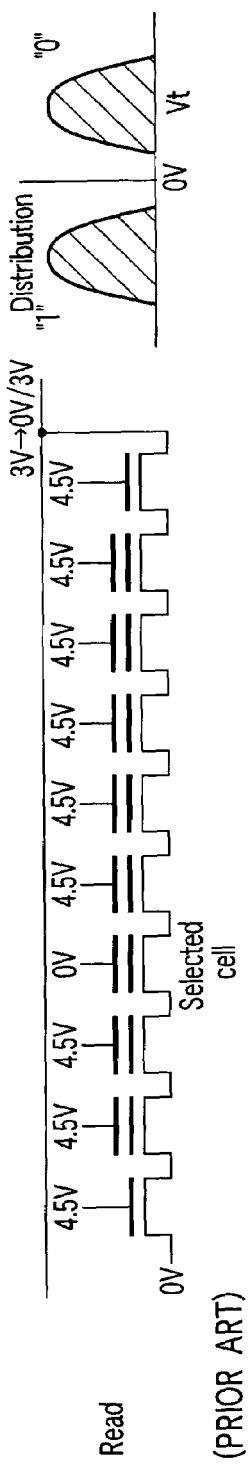
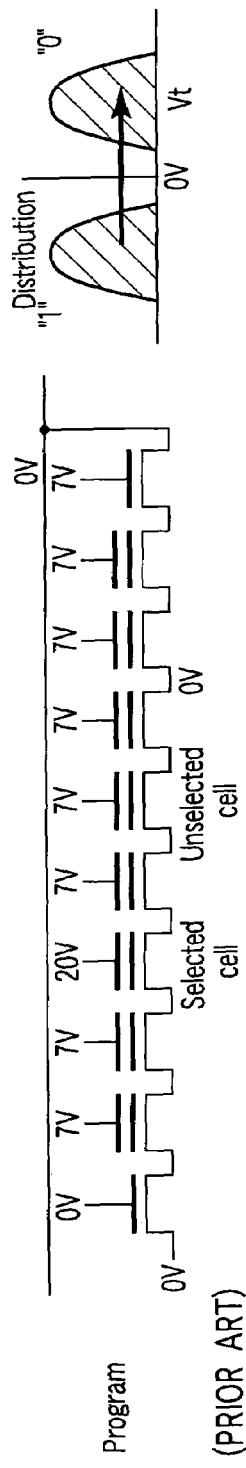
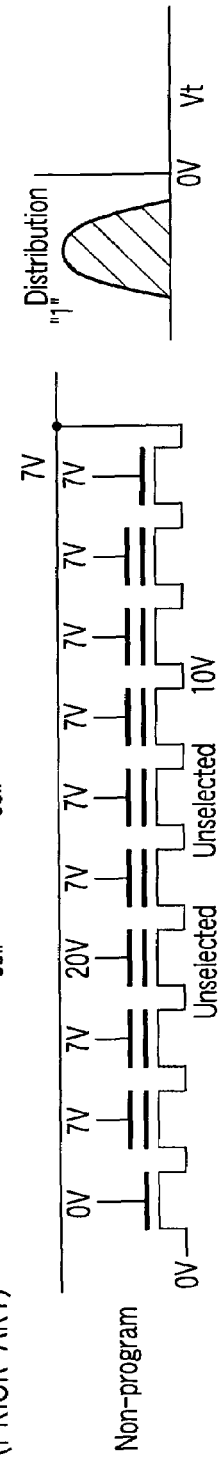
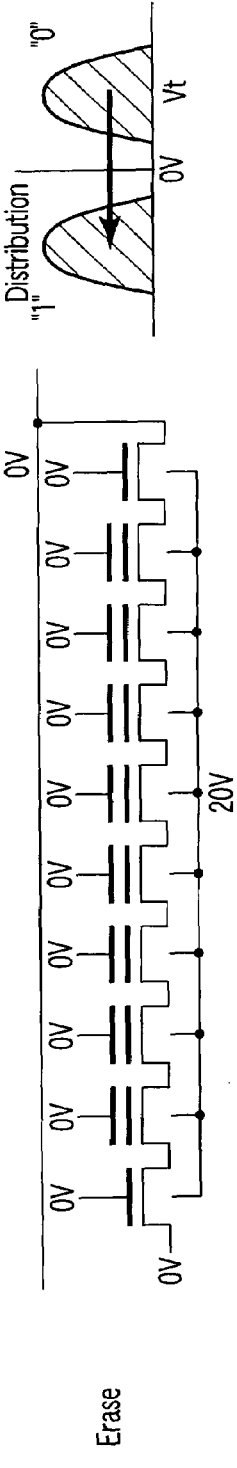
F I G. 3A (PRIOR ART) Read
F I G. 3B (PRIOR ART) Program
F I G. 3C (PRIOR ART) Non-program
F I G. 3D (PRIOR ART) Erase

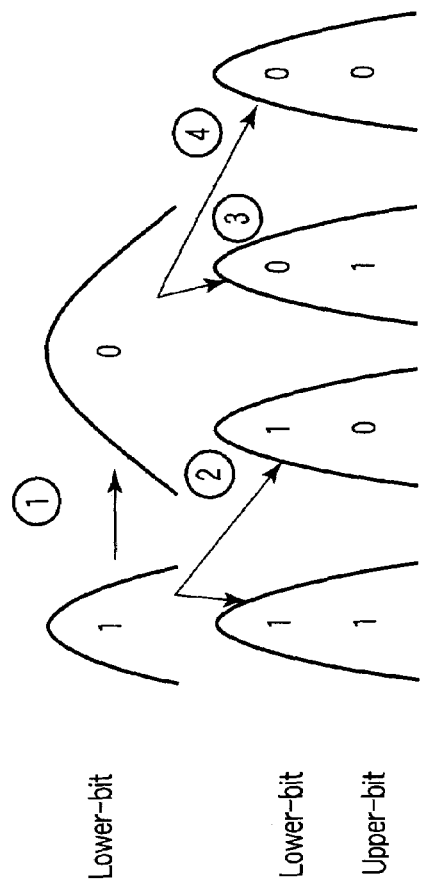
FIG. 4 (PRIOR ART)
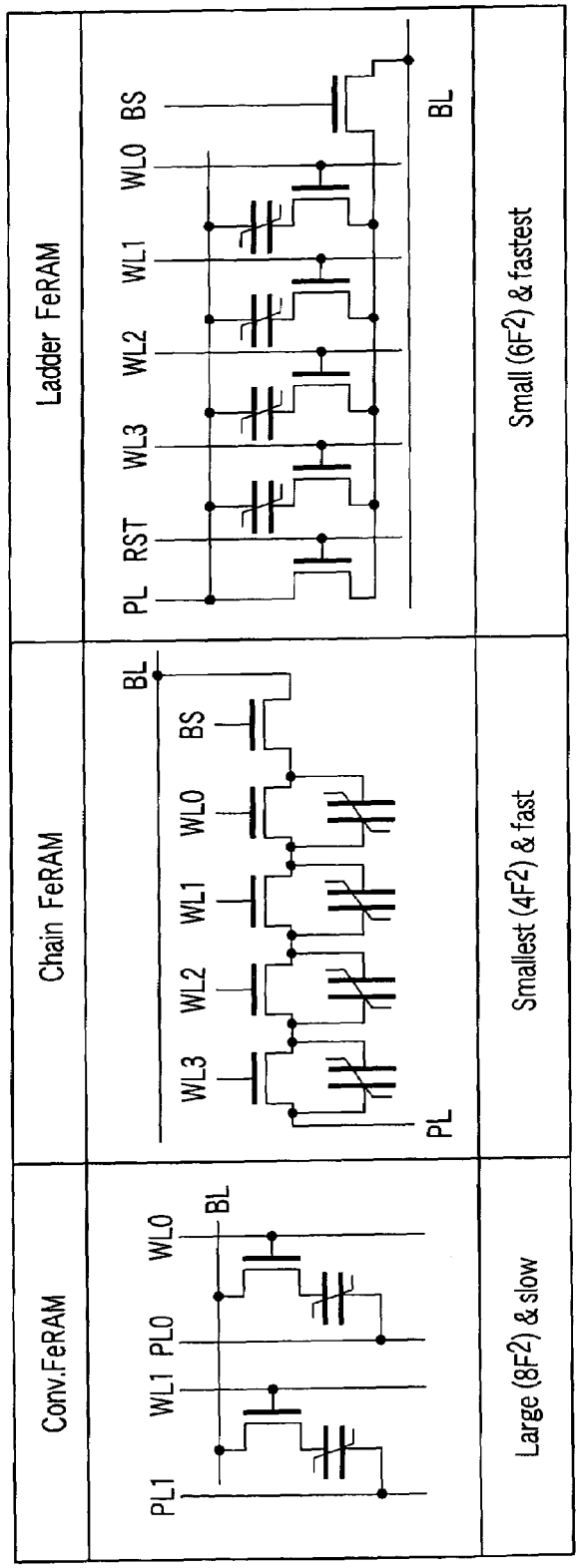
FIG. 5A (PRIOR ART)
FIG. 5B (PRIOR ART)
FIG. 5C (PRIOR ART)

Stand-by state

When WL2 is selected

Stand-by state

When WL2 is selected

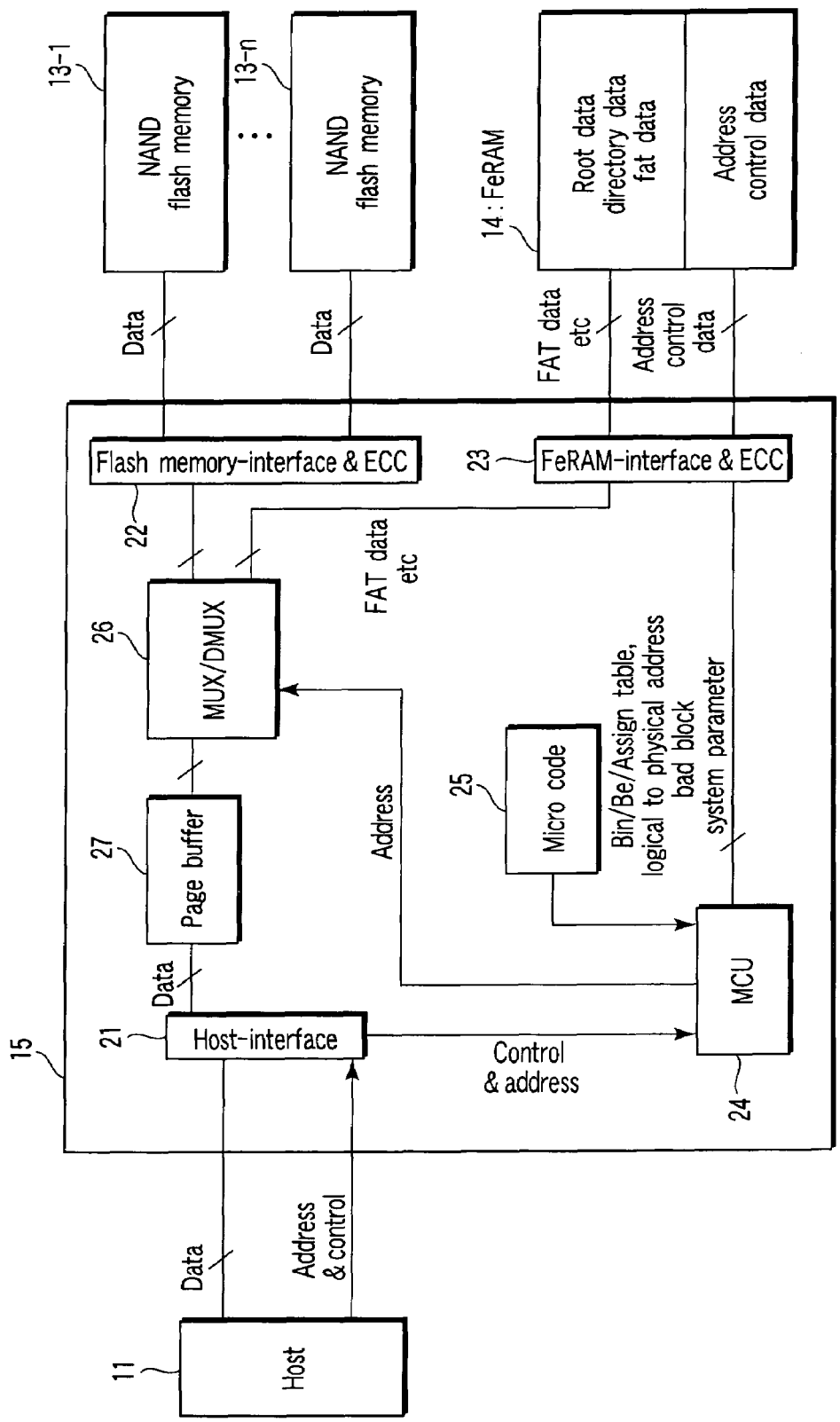
F I G. 11

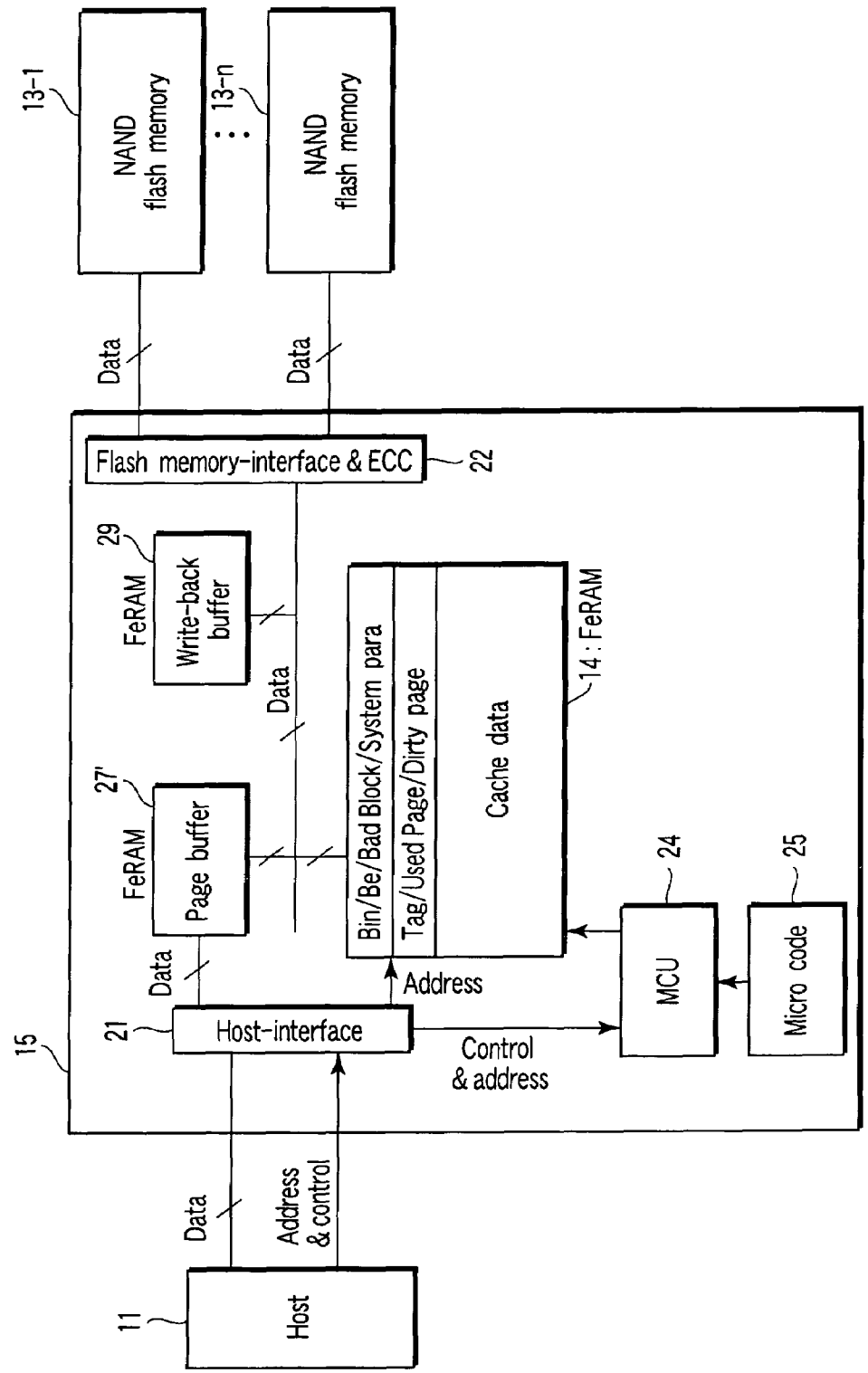
F I G. 16

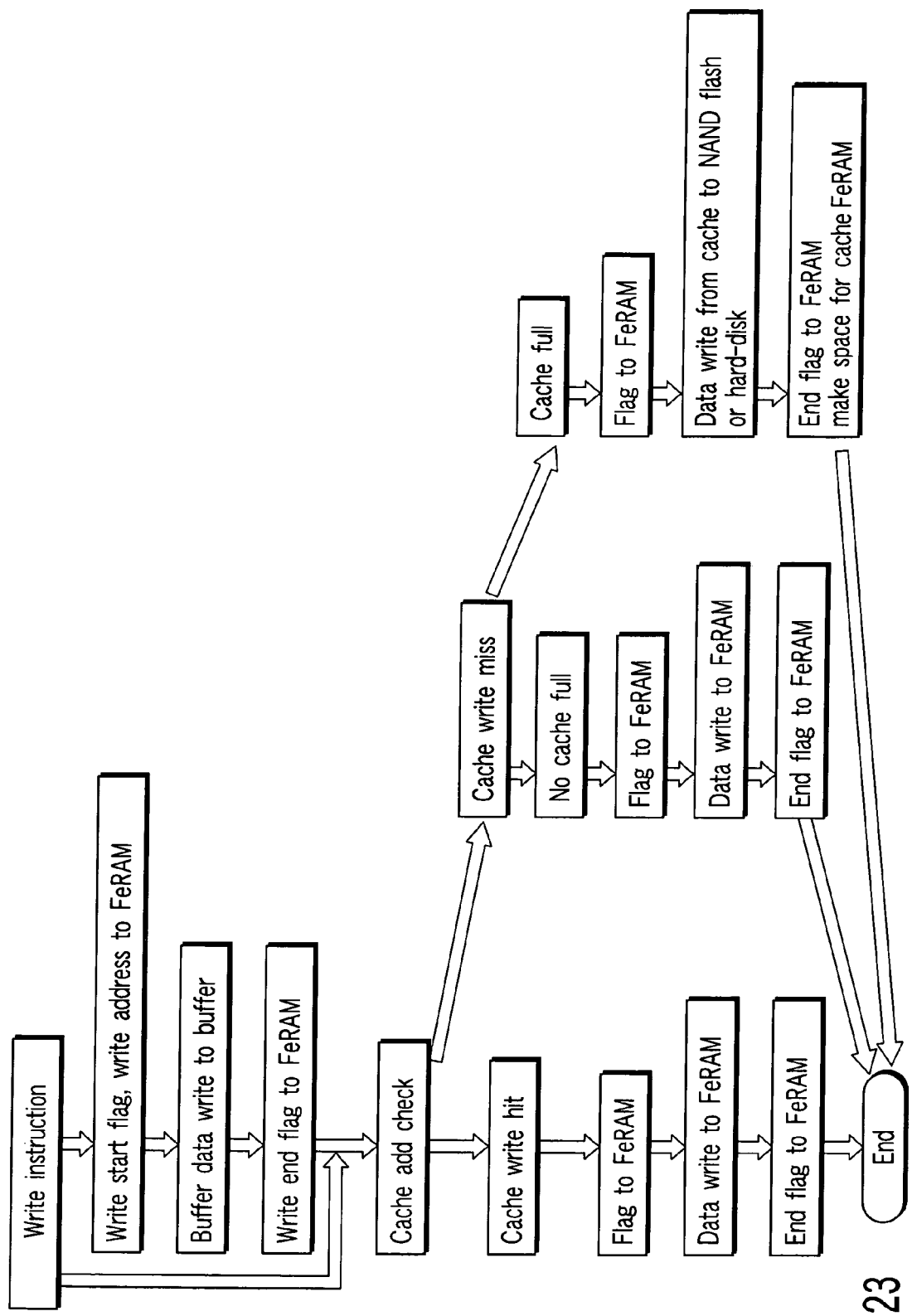
F I G. 23

MEMORY SYSTEM COMBINING FLASH EEPROM AND FERAM

CROSS-REFERENCE TO RELATED APPLICATIONS

This application is based upon and claims the benefit of priority from prior Japanese Patent Application No. 2005-162795, filed Jun. 2, 2005, the entire contents of which are incorporated herein by reference.

BACKGROUND OF THE INVENTION

1. Field of the Invention

The present invention relates to a memory system which is formed by combining a flash EEPROM type nonvolatile memory for file storage, such as a NAND flash memory, having a large capacity but requiring a long read shift time, long programming time, and long erase time, an FeRAM having a medium capacity but capable of high-speed read/write, and a controller which controls the nonvolatile memory and FeRAM. This memory system makes it possible to increase the speed of read/write of data having a small file size, increase the speed of read/write of, e.g., a file allocation table (FAT) and directory information, prevent deterioration of the performance of reading/writing effective data caused by, e.g., allocation table write necessary as a measure to cope with an instantaneous power failure, increase the speed of data to be frequently read or written, and facilitate changing the specification of the controller.

2. Description of the Related Art

Semiconductor memories are presently widely used in many apparatuses such as main memories of mainframe and personal computers, household electric appliances, and cellphones. Those which are predominate in the market are flash EEPROM type nonvolatile memories represented by a NAND flash memory, and various types of memory cards (SD card, MMC card, MS card, and CF card) are used as media for storing information such as still images, motion images, sounds, and games in storage media of, e.g., digital cameras, digital videos, music players such as MP3, mobile PC's, and digital TV. USB compatible cards are also extensively used as storage media of PCs.

The flash EEPROM type nonvolatile memories are roughly classified into a NOR memory and NAND memory. The NOR memory can perform high-speed write, and can also perform read about $10^{13}$ times. This NOR memory is used to store instruction codes in a mobile gear. However, the NOR memory is unsuitable for file recording because the effective bandwidth of write is small.

On the other hand, the NAND memory can be highly integrated compared to the NOR memory. Although the access time is as long as 25 μs, burst read can be performed, and the effective bandwidth is large. Also, the program time and erase time of write are as long as 200 μs and about 1 ms, respectively, but a large number of bits can be programmed or erased at once. This makes it possible to load write data in a burst manner and program a large number of bits at once. Therefore, the NAND memory is a memory having a large effective bandwidth. By making the most of these advantages, the NAND memories are used in memory cards and USB memories as described above, and are recently used in memories of cellphones.

FIGS. 1A to 1C each show the memory cell structure of a NAND flash EEPROM, in which FIG. 1A shows a planar layout of a cell block, FIG. 1B shows a sectional view of a memory cell, and FIG. 1C shows an equivalent circuit of the cell block. As shown in FIG. 1C, a plurality of floating gate type transistors are arranged in series, and selection transistors are arranged between one terminal of the series circuit and a bit line BL and between the other terminal of the series circuit and a source line SL. Since memory cells are arranged one by one at the intersections of word lines WL0, WL1, . . . , WL7 and the bit line BL, this memory is most suitable for high integration.

FIG. 2 shows the arrangement of a memory cell array in which the cell blocks described above are arranged. A unit for performing erase is a memory cell block unit shown in FIGS. 1A to 1C when viewed in the bit direction, and is one entire mat when viewed in the word line direction. This erase unit has a capacity of about 256 KB. The erase unit is divided into a plurality of units, and each divided unit is called a block. A program unit corresponds to one word line in the erase block and every other bit line (an even-numbered bit line EvenBL or odd-numbered bit line OddBL). When the number of series-connected cells is 32, the program unit is 256 KB/32/2=4 KB. This program unit is called a page. In this example, the block/page ratio is 64. One of the odd-numbered bit lines OddBL and even-numbered bit lines EvenBL is read in a read operation as well. When the even-numbered bit line EvenBL is to be read, for example, the odd-numbered bit line OddBL is set at Vss in order to reduce the interference noise between them.

FIGS. 3A to 3D illustrate examples of read, program, non program, and erase operations of the NAND flash, respectively. In the read operation, the word line of a cell to be read are set at 0V, and the rest is changed to High. If a threshold voltage Vt of the cell transistor is Vt<0, the potential of the bit line BL lowers. If Vt>0, the bit line BL stays High, and the cell data is read out.

In the erase operation, the well potential of the whole cell block is set at 20V, and the rest are set at 0V, thereby drawing electrons of the floating gate to the well by a tunneling current to make the threshold voltage Vt lower than 0V. Accordingly, the erase unit is a large unit of 256 KB.

The program operation is performed by respectively setting the word line and bit line of a selected cell at 20V and 0V, thereby raising the threshold voltage by injecting electrons into the floating gate by a tunneling current.

In this state, the word line of each unselected cell in the same block is set at about 7V to decrease the applied voltage to an unselected transistor and suppress write. For a bit not to be written of the selected word line, the bit line is set at 7V, and an unselected word line is raised to 7V to boot the source and drain voltages of the cell transistor, thereby suppressing write. This example is a binary method which stores 1-bit information in one cell. Recently, however, a quaternary method which stores 2-bit information in one cell is beginning to be used.

FIG. 4 is a schematic diagram showing a case in which four values are given to the threshold voltage of one cell (cell transistor). In the first programming, 1 or 0 is written in a lower bit. In the second programming, an upper bit is written. This gives the four threshold voltage distributions of the cell. Although this quaternary method is suited to increasing the density, the threshold voltage Vt of the cell transistor must be suppressed to the distribution within a narrow range. This makes the program time and erase time longer than those of the binary method. In addition, a read operation requires determination at least twice, so it takes a long time to start reading out data.

As other flash EEPROMs, memories called AND and DINOR are known. The AND memory is suitable for high speed write and used as a file storage memory. The DINOR memory is similar to the AND memory, but suitable for high speed read and mainly used as an instruction code storage of a cellphone or the like.

In a memory system such as a memory card using the NAND flash described above or the like, one or several NAND flashes and a controller for controlling the NAND flash or NAND flashes are mounted on the card. This controller has the four functions described below.

First, the controller has an interface circuit on the host side, and performs read/write from the host to the NAND.

Second, the controller has an interface circuit of the NAND, and performs read/write from the NAND to the host.

Third, the controller performs address management/bad block management and the like when writing data in the NAND.

Fourth, the controller controls write to a block corresponding to, e.g., a FAT or directory by using a relatively small unit smaller than the block.

In the memory system using the NAND flash described above, however, data holding basically takes a long time for read/program/erase, and this time further prolongs on the card level or OS level. In particular, read/write of a small file is the worst case.

One solution to this problem is to use a ferroelectric memory (to be referred to as an FeRAM hereinafter) as a nonvolatile memory capable of high-speed read/write as a storage medium similarly to a DRAM, and also capable of storing information even when the power supply is turned off. In addition to the ability to perform high-speed read/write, the ferroelectric memory can be rewritten $10^{13}$ to $10^{16}$ times, has a read/write time equivalent to that of a DRAM, and can operate at 3 to 5V. The ferroelectric memory having these advantages is also called an ultimate memory. The use of the ferroelectric memory can solve the problem of slow read/write of the NAND flash.

Unfortunately, the FeRAM is presently not so highly integrated as the NAND flash, and therefore incurs a high cost.

The FeRAM will be briefly explained below. FIG. 5A shows a memory cell having one transistor and one capacitor of a conventional ferroelectric memory. In this memory cell of the conventional ferroelectric memory, the transistor and capacitor are connected in series. A memory cell array includes a bit line BL for reading out data, word lines WL0 and WL1 for selecting a transistor, and plate lines PL0 and PL1 for driving one terminal of the ferroelectric capacitor.

In this conventional ferroelectric memory, however, to prevent destruction of polarization information in the ferroelectric capacitor of an unselected cell, the plate lines are disconnected by the word lines and must be individually driven. Accordingly, a driving circuit of the plate lines is as very large as 20% to 30% of the chip size, and the plate line driving time is long.

To solve the above problem, the present inventors have proposed a new nonvolatile ferroelectric memory capable of simultaneously achieving (1) a small memory cell, (2) a readily fabricable planar transistor, and (3) a versatile high-speed random access function in prior applications (Jpn. Pat. Appln. KOKAI Publication Nos. H10-255483, H11-177036, and 2000-22010). FIG. 5B shows the arrangement of this ferroelectric memory of the above prior applications. In the prior applications, one memory cell is formed by connecting a cell transistor and ferroelectric capacitor in parallel and one memory cell block is formed by connecting a plurality of parallel circuits of memory cells in series. One terminal of the block is connected to a bit line BL via a block select transistor, and the other terminal of the block is connected to a plate line PL. The operation is as follows. In a standby state, as shown in FIG. 6A, all word lines WL0, WL1, . . . , WL3 are changed to High to turn on the memory cell transistors, and a block select signal BS is changed to Low to turn off the block select transistor. Since the two terminals of the ferroelectric capacitor are electrically shorted by the ON transistor, no potential difference is produced between them, so the stored polarization is stably held.

In an active state, as shown in FIG. 6B, only a transistor connected in parallel to a ferroelectric capacitor to be read is turned off, and the block select transistor is turned on. After that, the plate line PL and block select signal BS are changed to High. Accordingly, the potential difference between the plate line PL and bit line BL is applied only to the two terminals of a ferroelectric capacitor C1 connected in parallel to the off-transistor, so polarization information of this ferroelectric capacitor is read out to the bit line BL. Although the cells are connected in series, therefore, cell information of a given ferroelectric capacitor is read out by selecting a given word line, so complete random access can be realized. Also, since the plate line can be shared by a plurality of memory cells, it is possible to increase the area of a plate line driving circuit (PL driver) while the chip size is reduced, and to realize a high-speed operation.

In addition, the present inventors have proposed a ferroelectric memory capable of an ultra high speed operation in Jpn. Pat. Appln. KOKAI Publication No. 2005 209324. In this memory, as shown in FIG. 5C, a ferroelectric capacitor and cell transistor are connected in series to form each cell, and a plurality of cells are connected in parallel. A reset transistor is further connected in parallel to this parallel circuit, and the obtained paralled circuit is connected to a bit lie via a block transistor. This ferroelectric memory can achieve the effects of the prior applications described above, and can also further increase the operating speed by the effect of connecting the series circuits of cells in parallel. This is so because in the standby state, it is possible to short circuit all ferroelectric caps via the reset transistor by turning on all the cell transistors, and to share the plate driving line, unlike in the conventional ferroelectric memory.

When this ferroelectric memory is in the standby state, as shown in FIG. 6C, all word lines WL0 to WL3 are changed to High to turn on the transistors, a reset signal RST is changed to High to turn on the reset transistor, and a block select signal BS is changed to Low to turn off the block select transistor. In this manner, the two terminals of the ferroelectric capacitor is set at the potential (0V) of a plate line PL.

In the active state, as shown in FIG. 6D, only a transistor connected in series with a ferroelectric capacitor to be read is turned on, the reset transistor is turned off, and the block select transistor is turned on. After that, the plate line PL is raised from 0 to 1.9V, thereby applying the potential difference between the plate line PL and bit line BL only to the two terminals of the ferroelectric capacitor C2. Consequently, polarization information of the ferroelectric capacitor C2 is read out to the bit line BL.

As shown in FIGS. 7A and 7B, an MRAM is also proposed as a nonvolatile memory capable of high-speed read/write. This MRAM is a memory in which a thin film of, e.g., $Al_2O_3$ is sandwiched between magnetic layers (fixing layer and free layer), and an electric current in the thin film increases if the spin directions in the upper and lower magnetic layers are the same, and reduces if the spin directions are opposite. This difference gives the memory a binary value.

Although the MRAM is capable of high-speed read/write similarly to the FeRAM, the chip size is larger and the cost is higher than those of the NAND flash. A phase change memory (also called a PRAM) having a relatively short write time is also proposed, but the cost of this memory is also high.

As described above, a memory system using the flash EEPROM or the like is slow in read and takes a long program/erase time. In addition, extra system information must be written on the card level or OS level, and this further extends the time. In particular, read/write of a small file is the worst case.

One solution to this problem is a memory system using a nonvolatile memory such as an FeRAM, MRAM, or PRAM capable of high-speed read/write. However, a nonvolatile memory of this type poses another problem of high cost.

BRIEF SUMMARY OF THE INVENTION

According to an aspect of the present invention, there is provided a memory system comprising a ferroelectric memory formed by arranging a plurality of memory cells comprising a ferroelectric capacitor and a cell transistor, a flash EEPROM formed by arranging a plurality of memory cells having a floating gate and configured to electrically erase and write data, a control circuit configured to control the ferroelectric memory and the flash EEPROM, and an interface circuit configured to communicate externally, wherein the flash EEPROM stores data, and the ferroelectric memory stores root information for storing the data, directory information, a file name of the data, a file size of the data, file allocation table information storing a storage location of the data, or a write completion time of the data.

According to another aspect of the present invention, there is provided a memory system comprising a ferroelectric memory formed by arranging a plurality of memory cells comprising a ferroelectric capacitor and a cell transistor, a flash EEPROM formed by arranging a plurality of memory cells having a floating gate and configured to electrically erase and write data, a control circuit configured to control the ferroelectric memory and the flash EEPROM, and an interface circuit configured to communicate externally, wherein the control circuit or the ferroelectric memory stores information which defines areas of a logical address space which are to be stored in the flash EEPROM and the ferroelectric memory.

According to still another aspect of the present invention, there is provided a memory system comprising a ferroelectric memory formed by arranging a plurality of memory cells comprising a ferroelectric capacitor and a cell transistor, a flash EEPROM formed by arranging a plurality of memory cells having a floating gate and configured to electrically erase and write data, a control circuit configured to control the ferroelectric memory and the flash EEPROM, and an interface circuit configured to communicate externally, wherein the flash EEPROM stores data, and the ferroelectric memory stores flag information indicating that actual recording of the data into the flash EEPROM is started, or flag information indicating that actual recording of the data into the flash EEPROM is completed.

According to still another aspect of the present invention, there is provided a memory system comprising a ferroelectric memory formed by arranging a plurality of memory cells comprising a ferroelectric capacitor and a cell transistor, a flash EEPROM formed by arranging a plurality of memory cells having a floating gate and configured to electrically erase and write data, a control circuit configured to control the ferroelectric memory and the flash EEPROM, and an interface circuit configured to communicate externally, wherein the flash EEPROM stores data, and the ferroelectric memory stores a flag indicating whether page or block of the flash EEPROM is used, and a flag indicating whether page or block of the flash EEPROM is unusable.

According to still another aspect of the present invention, there is provided a memory system comprising a ferroelectric memory formed by arranging a plurality of memory cells comprising a ferroelectric capacitor and a cell transistor, a flash EEPROM formed by arranging a plurality of memory cells having a floating gate and configured to electrically erase and write data, a control circuit configured to control the ferroelectric memory and the flash EEPROM, and an interface circuit configured to communicate externally, wherein when data write is designated from the outside, a write start flag, write data, a write address, and a write end flag to the ferroelectric memory are written in the ferroelectric memory, and then the data is written in the flash EEPROM, and a write start flag, write data, a write address, and a write end flag to the flash EEPROM are written in the ferroelectric memory.

According to still another aspect of the present invention, there is provided a memory system comprising a ferroelectric memory formed by arranging a plurality of memory cells comprising a ferroelectric capacitor and a cell transistor, a flash EEPROM formed by arranging a plurality of memory cells having a floating gate and configured to electrically erase and write data, a control circuit configured to control the ferroelectric memory and the flash EEPROM, and an interface circuit configured to communicate externally, wherein when data write is designated from the outside, a write end flag to the ferroelectric memory is written in the ferroelectric memory, and then a write end flag to the flash EEPROM is written in the ferroelectric memory.

According to still another aspect of the present invention, there is provided a memory system comprising a ferroelectric memory formed by arranging a plurality of memory cells comprising a ferroelectric capacitor and a cell transistor, a flash EEPROM formed by arranging a plurality of memory cells having a floating gate and configured to electrically erase and write data, a control circuit configured to control the ferroelectric memory and the flash EEPROM, and an interface circuit configured to communicate externally, wherein data having the same logical address is permitted to be stored in the flash EEPROM and the ferroelectric memory, and the ferroelectric memory stores a first flag indicating the permission of the storage, second flag information indicating whether contents of data stored in the same logical address of the flash EEPROM and the ferroelectric memory are the same or different, information of the logical address, and a physical address to be stored in the flash EEPROM.

BRIEF DESCRIPTION OF THE SEVERAL VIEWS OF THE DRAWINGS

FIG. 3A shows a circuit diagram and cell transistor threshold voltage distribution graph for explaining a read operation of the conventional NAND flash EEPROM;

FIG. 3B shows a circuit diagram and cell transistor threshold voltage distribution graph for explaining a program operation of the conventional NAND flash EEPROM;

FIG. 3C shows a circuit diagram and cell transistor threshold voltage distribution graph for explaining a non-program operation of the conventional NAND flash EEPROM;

FIG. 3D shows a circuit diagram and cell transistor threshold-voltage distribution graph for explaining an erase operation of the conventional NAND flash EEPROM;

FIG. 4 is a schematic diagram for explaining a multilevel operation of the conventional NAND flash EEPROM;

FIG. 5A is a circuit diagram showing a conventional ferroelectric memory;

FIG. 5B is a circuit diagram showing a ferroelectric memory of a prior application;

FIG. 5C is a circuit diagram showing an improved ferroelectric memory of another prior application;

FIG. 11 is a block diagram showing a memory system according to the second embodiment of the present invention;

FIG. 16 is a block diagram showing a memory system according to the seventh embodiment of the present invention;

FIG. 23 is a diagram showing the algorithm of a write operation of a memory system according to the 14th embodiment of the present invention.

DETAILED DESCRIPTION OF THE INVENTION

Prior to the explanation of embodiments, the problems of the conventional memory systems studied by the present inventors will be explained below with reference to FIGS. 8 and 9. After that, various embodiments of memory systems capable of solving the problems will be explained.

Figure 1A:
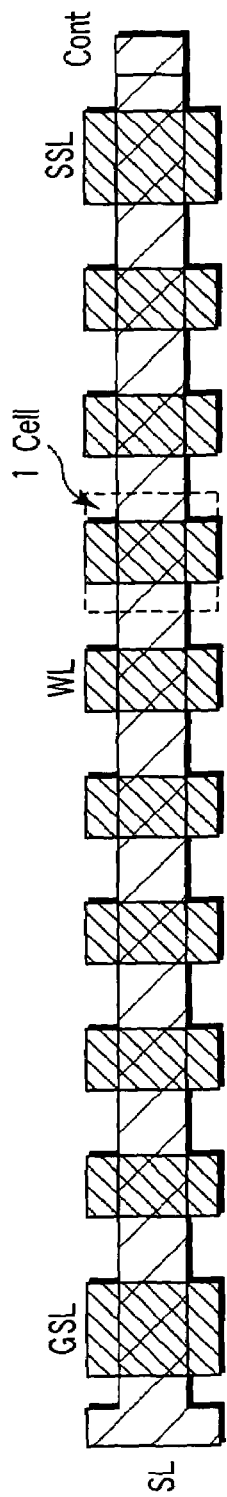
FIG. 1A is a cell block planar layout showing the memory cell structure of a conventional NAND flash EEPROM.
Figure 1B:
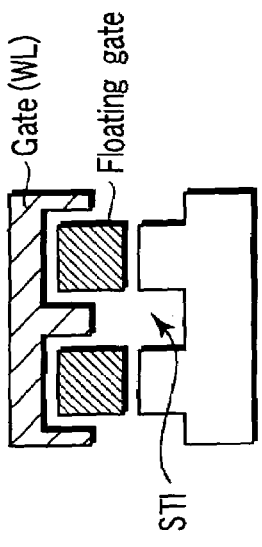
FIG. 1B is a memory cell sectional view showing the memory cell structure of the conventional NAND flash EEPROM.
Figure 1C:
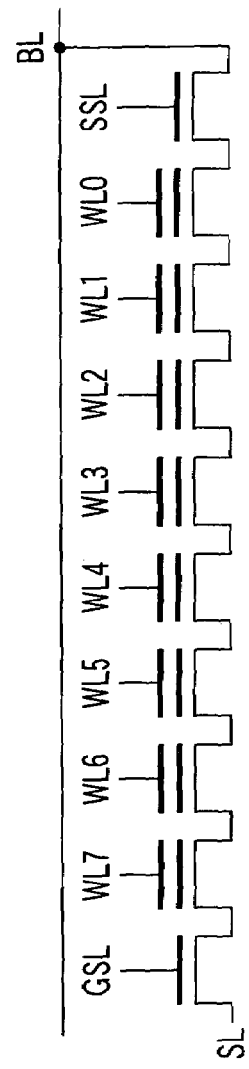
FIG. 1C is a cell block equivalent circuit diagram showing the memory cell structure of the conventional NAND flash EEPROM.
Figure 2:
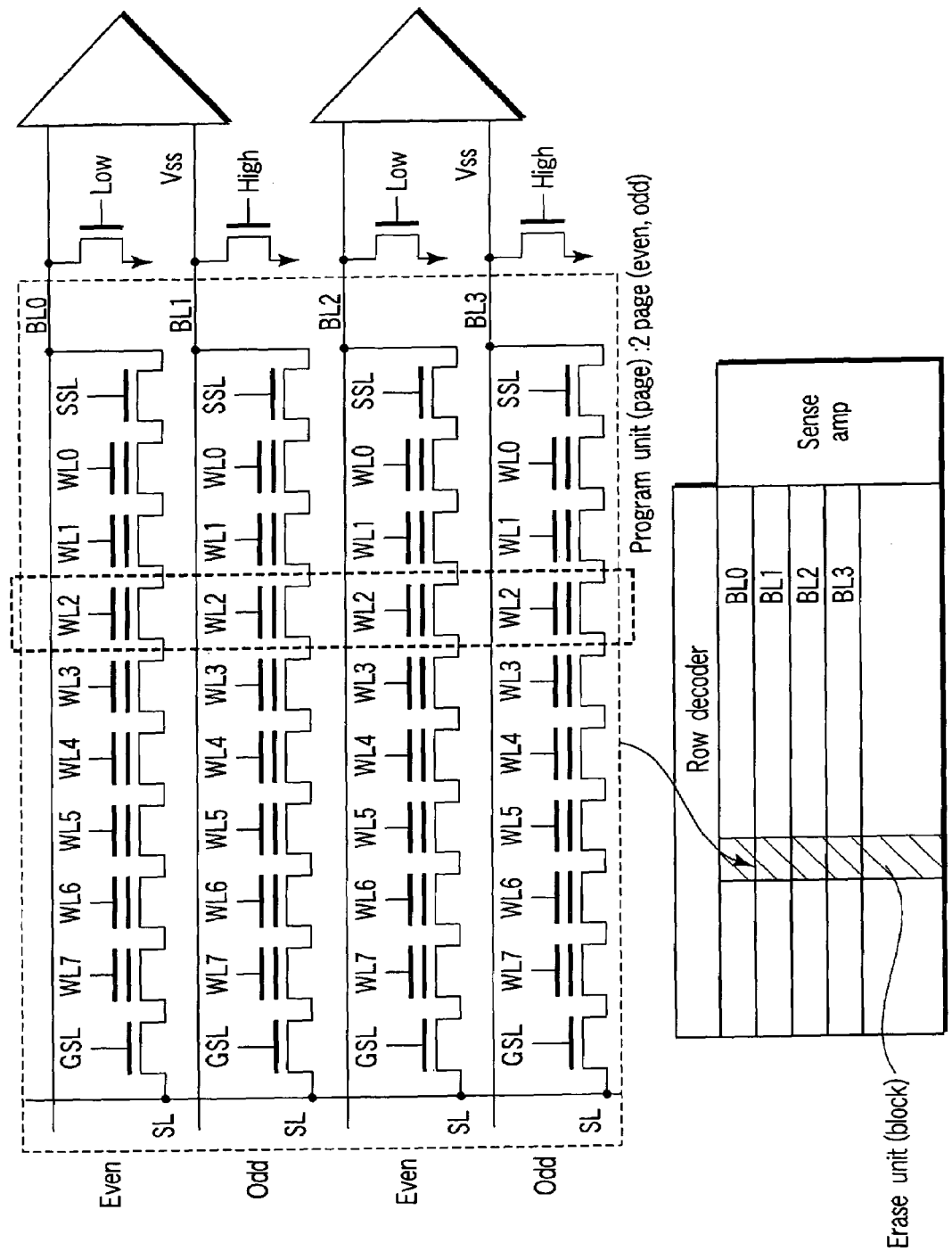
FIG. 2 shows a circuit diagram and block diagram for explaining a memory cell array of the conventional NAND flash EEPROM.
Figure 6A:
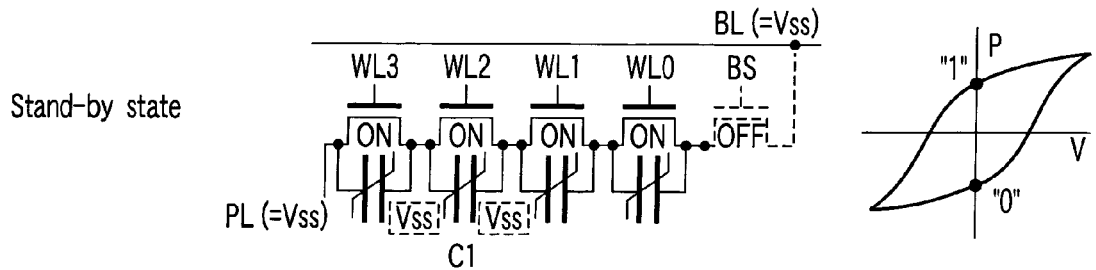
FIG. 6A shows a circuit diagram and graph for explaining a stand-by operation of a ferroelectric memory of a prior application.
Figure 6B:
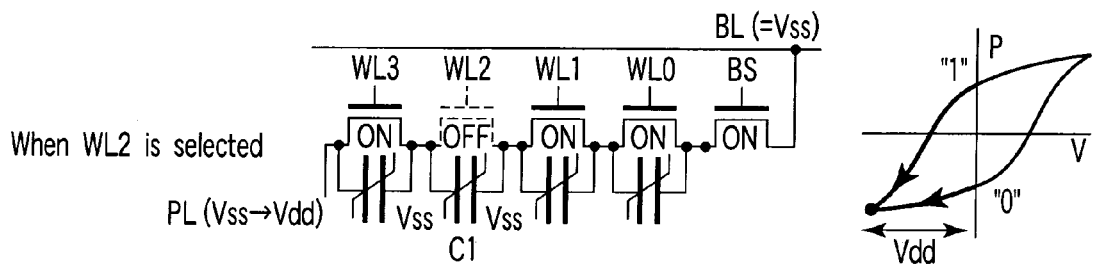
FIG. 6B shows a circuit diagram and graph for explaining an active operation of the ferroelectric memory of the prior application.
Figure 6C:
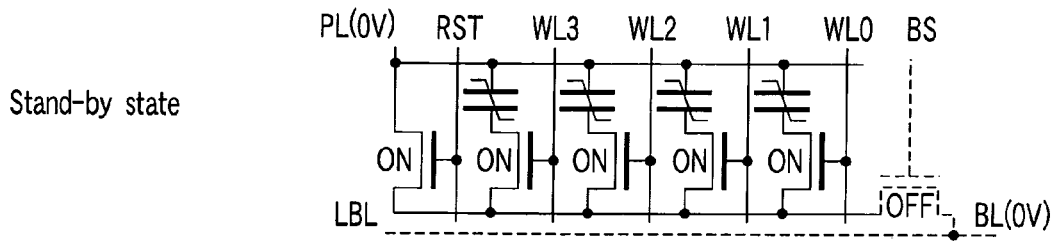
FIG. 6C shows a circuit diagram and graph for explaining an operation example of a ferroelectric memory of another prior application.
Figure 6D:
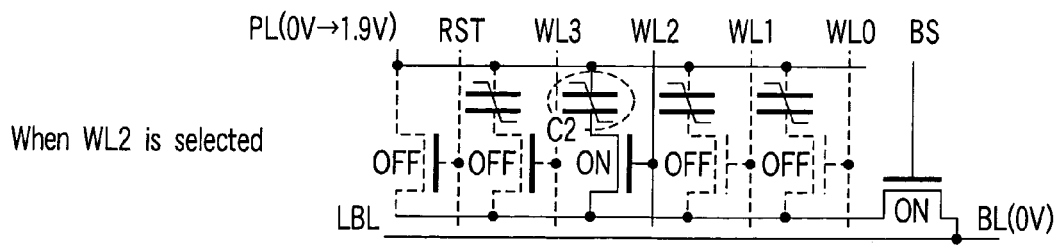
FIG. 6D shows a circuit diagram and graph for explaining an operation example of the ferroelectric memory of the other prior application.
Figure 7A:
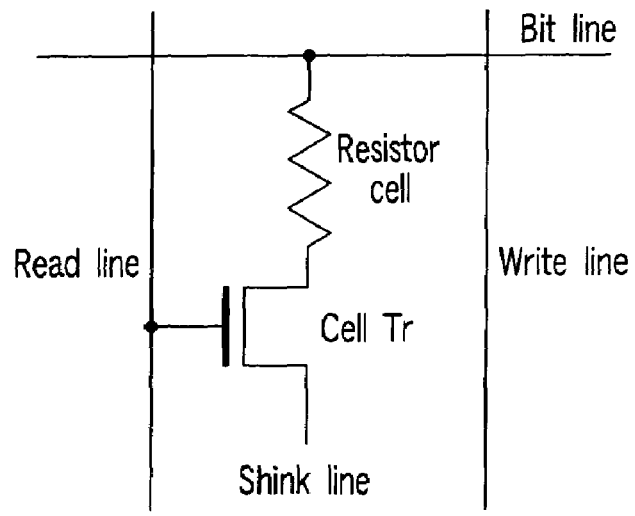
FIG. 7A is a circuit diagram showing a conventional memory using the magnetoresistive effect.
Figure 7B:
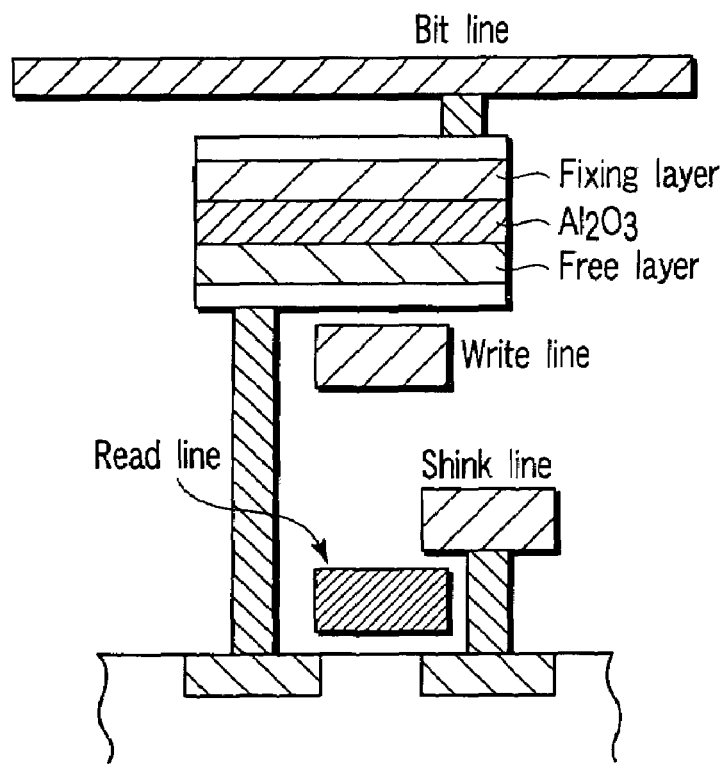
FIG. 7B is a sectional view showing the arrangement of the conventional memory using the magnetoresistive effect.
Figure 8:
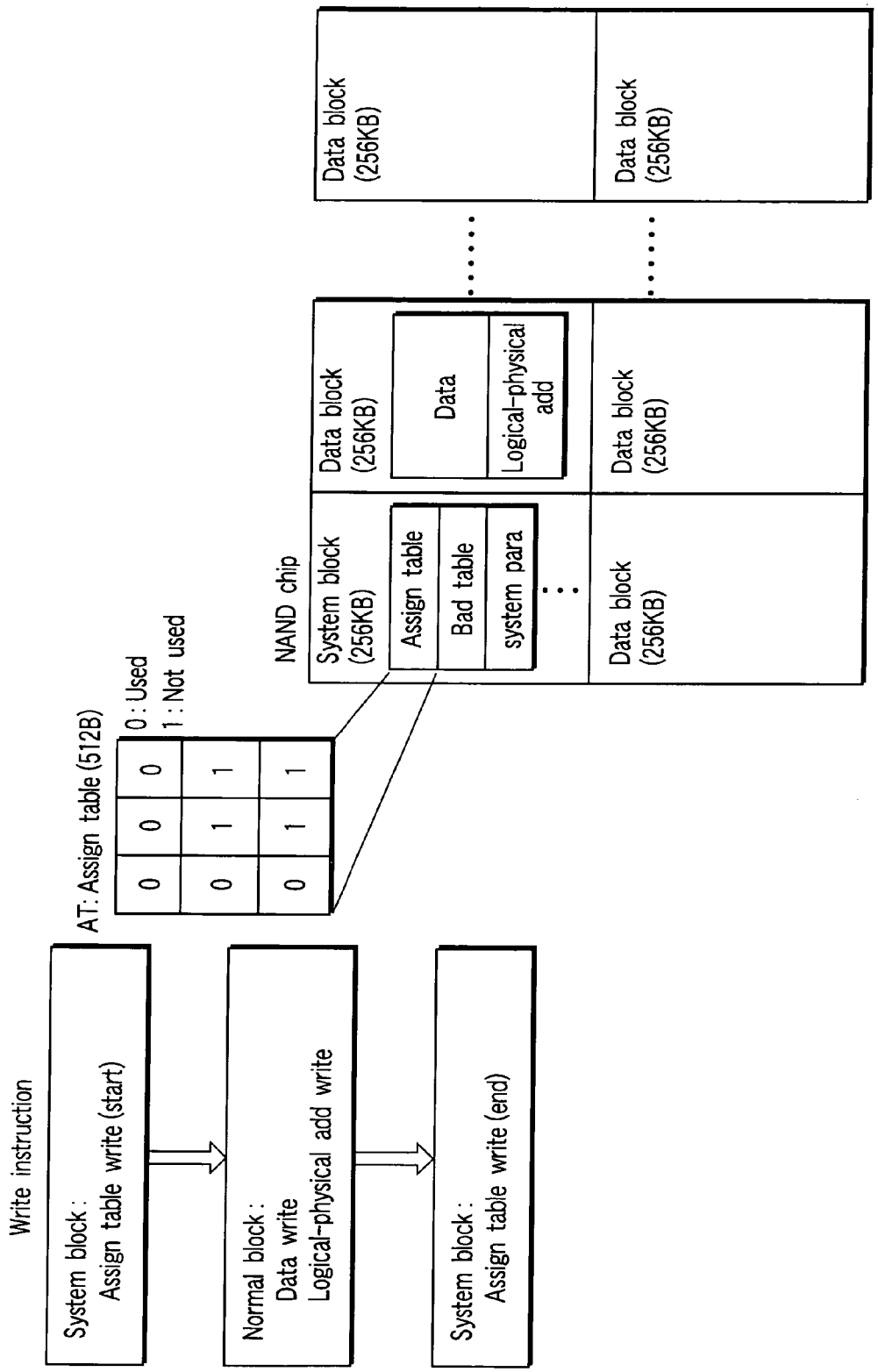
FIG. 8 is a schematic diagram for explaining the problems of the conventional memory system studied by the present inventors, in which an operation example of a memory card is illustrated.
Figure 9:
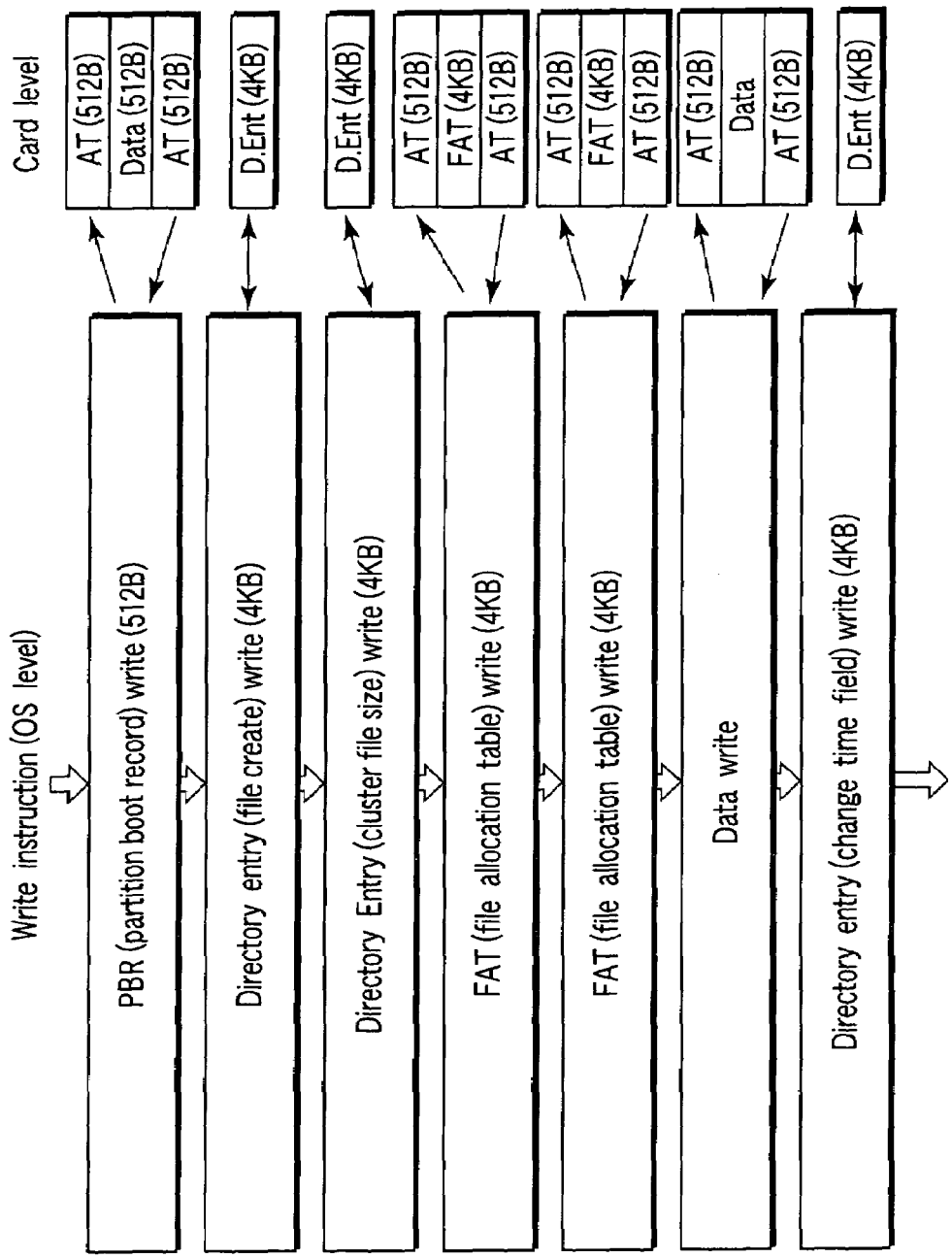
FIG. 9 is a schematic diagram for explaining the problems of the conventional memory system studied by the present inventors, in which a file write sequence in the conventional OS operation is illustrated.

FIG. 8 is a schematic diagram showing an operation when a write instruction is input to an SD card or the like from the host. FIG. 9 is a schematic diagram showing a file write sequence performed by the conventional OS operation.

Before writing data in a flash (a NAND flash memory will be referred to as a flash hereinafter), a controller writes, in an assign table of a system block in the flash, a flag indicating the start of data write in a bit corresponding to a block in which the data is to be written (when this flag is written, its value is 0), in order to take a measure to cope with sudden removal of the card (including instantaneous power failure). After that, the controller writes data in page of the block corresponding to the actual data, and finally writes a logical-physical converted address.

This logical-physical converted address is address data indicating a portion of the original logical address to which the written data corresponds. After that, the controller writes, in another assign table of the system block in the flash, a flag indicating the completion of the data write in the bit corresponding to the block in which the data is written (when this flag is written, its value is 0), in order to indicate that the data is completely written. The meaning of this flag is that if sudden removal of the card or instantaneous power failure occurs during data write, it is necessary to determine the already written portion of the data and restore the data from the middle of it when the power supply is turned on again.

The system block also stores bad block information indicating an unusable block, system parameters, and the like. In this conventional memory system, the assign tables, logical-physical converted addresses, and the like are read out from the flash to a nonvolatile memory such as an SRAM on the controller side upon power-on. When data write occurs, the nonvolatile memory is updated, and the logical-physical converted address of the system block in the flash and that of a block in which the data is to be written are written. The conventional memory card having this arrangement poses the following problems.

First, the flash is programmed for each page (4 KB) by tunnel injection, so a time of 200 µs is necessary. Therefore, it takes 200 µs in order to write even a 512-B assign table. Accordingly, to prevent data destruction and sudden removal of the card and take a measure to cope with instantaneous power failure, it takes 400 µs to write the assign tables at the start and end of data write. To write 4-KB data, therefore, the write time which is originally 200 µs extends to 600 µs, and this decreases the effective write bandwidth to ⅓.

Second, since logical-physical addresses are also written in the flash, logical-physical addresses written simultaneously with data of all blocks in the flash must be read out to the controller upon power-on. When a time of 25 μs required at the beginning of read shift is taken into consideration, about one second is necessary to read all the logical-physical addresses scattered in the flash. This is so because the storage location of data cannot be known without the address even if a read/write instruction is received. Accordingly, the conventional memory system cannot read or write data immediately after power-on, and hence cannot control rapid photographing of a digital camera or the like. It is also possible to gather logical-physical addresses to one portion, but read and programming concentrate to this portion to pose problems in the flash having write limitations.

Third, the write performance further deteriorates if the memory is controlled by an operating system (OS) such as Windows (registered trademark). To write, e.g., 4-KB data in a medium such as a hard disk drive, memory card, DVD, or CD, as shown in FIG. 9, it is necessary to write 20-KB system data such as root information, directory information, the file size, the address where the file is stored, and the write completion time. This extremely increases the number of times of write. When these pieces of information are written in a memory system using a flash or the like, they are programmed in different places. Furthermore, when the address (FAT) where the file is stored is to be written in a memory system such as a flash, an assign table as a measure to cope with instantaneous power failure must be written twice. This makes the write time 10 times as long as the original write time when data is written in a flash or the like by the OS operation.

As described above, a memory system using a flash EEPROM or the like cannot rapidly read data and requires a long program/erase time. In addition, extra system information must be written on the card level or OS level, and this further prolongs the time. In particular, read/write of a small file is the worst case.

One solution to this problem is a memory system using a nonvolatile memory such as an FeRAM, MRAM, or PRAM capable of high-speed read/write, but the cost of this memory system is high.

The present invention is based on the consideration as described above, and has as its object to realize high-speed read/write by using a large-capacity memory system by combining a nonvolatile memory such as a flash EEPROM by which the capacity can be readily increased, and a nonvolatile memory such as an FeRAM, MRAM, or PRAM capable of high-speed read/write.

Embodiments of the present invention will be described below with reference to the accompanying drawing.

First Embodiment

Figure 10:
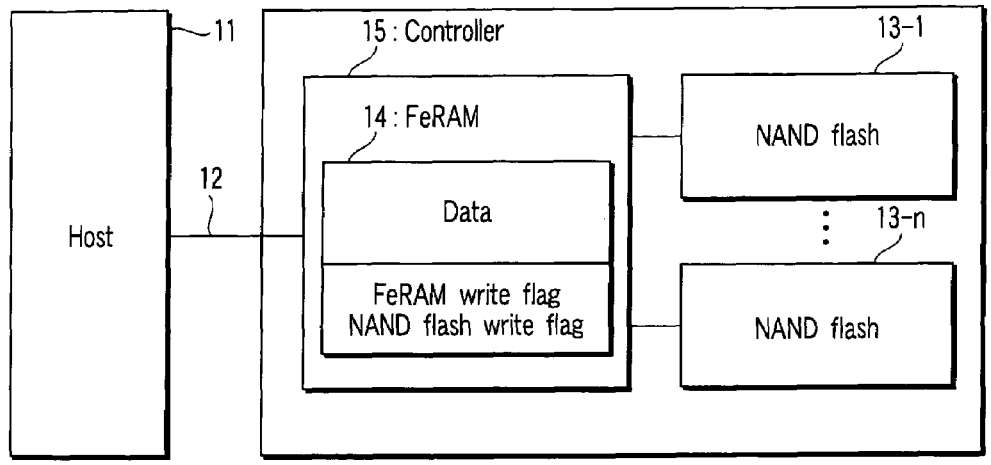
FIG. 10 is a block diagram showing a memory system according to the first embodiment of the present invention.

FIG. 10 is a block diagram showing a memory system according to the first embodiment of the present invention. This memory system includes a line 12 which connects to a host apparatus (Host) 11, NAND flash EEPROMs 13-1, . . . , 13-n for storing large-volume data, and a controller 15 which comprises a ferroelectric memory 14 for storing system information, data, and the like, communicates with the host apparatus 11, and controls the NAND flash EEPROMs 13-1, . . . , 13-n.

The ferroelectric memory 14 stores system information, data, and the like as described above. In addition, when a write instruction is input from the host apparatus 11, data is first written in the ferroelectric memory 14. More specifically, after a write start flag, the write address, and a write end flag to the ferroelectric memory 14 are written in the ferroelectric memory 14, the data is written in the flash EEPROMs 13-1, . . . , 13-n. In this case, a data write start flag, the write address, and a write end flag to the flash EEPROMs 13-1, . . . , 13-n are also written in the ferroelectric memory 14.

In this memory system, therefore, when a write instruction is input from outside the memory system, data is once written in the ferroelectric memory 14, and this data write viewed from outside the memory system is completed because the write end flag is ON. Even if instantaneous power failure, card removal, or the like occurs while the data is written in the flash EEPROMs 13-1, . . . , 13-n after that, it is only necessary to move and copy the data from the ferroelectric memory 14 to the flash EEPROMs 13-1, . . . , 13-n again when the power supply is turned on again.

Note that as the ferroelectric memory 14 of this embodiment, all the ferroelectric memories explained in "Description of the Related Art" can be used. Note also that an MRAM, PRAM, or the like may also be used instead of the ferroelectric memory 14, and all the systems explained in "Description of the Related Art" can be used as the flash EEPROMs 13-1, . . . , 13-n.

Second Embodiment

FIG. 11 is a block diagram showing a memory system according to the second embodiment of the present invention. This memory system includes NAND flash EEPROMs (NAND flash memories) 13-1, . . . , 13-n, a ferroelectric memory (FeRAM) 14, and a controller (NAND flash memory controller) 15. The controller 15 comprises an interface circuit (Host-Interface) 21 which interfaces with a host apparatus 11, an interface circuit (Flash Memory-Interface & ECC) 22 which interfaces with the NAND flash EEPROMs 13-1, . . . , 13-n, an interface circuit (FeRAM-Interface & ECC) 23 which interfaces with the ferroelectric memory 14, a micro control unit (MCU) 24 which controls the whole of the controller 15, the NAND flash EEPROMs 13-1, . . . , 13-n, and the ferroelectric memory 14, a micro code memory 25 for storing instruction codes (micro codes) and the like of the MCU 24, a multiplexer/demultiplexer (MUX/DMUX) 26, and a page buffer 27.

If a data area is designated by an address from the external host apparatus 11, the multiplexer/demultiplexer 26 switches the destination of data to the NAND flash EEPROMs 13-1, . . . , 13-n. The multiplexer/demultiplexer 26 switches the destination of data to the ferroelectric memory 14 if an address from the host apparatus 11 designates, e.g., root information for storing the data, directory information, the file name of the data, the file size of the data, file allocation table (FAT) information storing the storage location of the data, or write completion time information of the data.

In this configuration, the flash EEPROMs 13-1, . . . , 13-n having a large capacity but requiring a read start time, program time, and erase time are used as data storage memories requiring a large memory area, and the ferroelectric memory having a small capacity but capable of high-speed read/write stores information which requires only a small-capacity memory area but must be written in a number of small-capacity locations whenever data is written. This information for storing data is root information, directory information, the file name of the data, file size of the data, file allocation table information storing the storage location of the data, or the write completion time of the data. In this manner, it is possible to practically largely reduce the time during which the system information is written, and greatly improve the performance of the entire OS system and the overall memory system.

Especially when a data file size to be read or written is small, the storage amount of the system information is relatively large, so the effect of the present invention improves.

Also, when data is to be actually stored in the flash EEPROMs 13-1, ..., 13-n under the control of the MCU 24, the data is once written in the ferroelectric memory 14, and a write start flag Bin and write end flag Be are written in the ferroelectric memory 14. Since the data write viewed from outside the memory system is completed, the apparent write performance improves. By storing the write information in the flash EEPROMs 13-1, ..., 13-n after or simultaneously with this operation, it is possible to take a measure to cope with an instantaneous power failure as in FIG. 10.

In addition, when data is to be actually stored in the flash EEPROMs 13-1, ..., 13-n under the control of the MCU 24, system information such as a logical-physical converted address indicating the relationship between the physical address of the block position and page position and the actual logical address and the information of the start and end of write to the flash EEPROMs 13-1, ..., 13-n are also written in the ferroelectric memory 14. Since these pieces of system information can be rapidly written, most of the processing time is actually the data write time, so the effective write performance improves.

Furthermore, when bad block information and system parameters of the flash EEPROMs 13-1, ..., 13-n are also written in the ferroelectric memory 14, the number of times of access to the flash EEPROMs 13-1, ..., 13-n which operate slowly reduces, and this increases the processing speed. In addition, when logical-physical converted address information and bad block information are stored in the ferroelectric memory 14, a physical address in the flash EEPROMs 13-1, ..., 13-n which corresponds to the logical address is found immediately after the power supply of the memory system is turned on. This makes high-speed power-on feasible.

Third Embodiment

Figure 12:
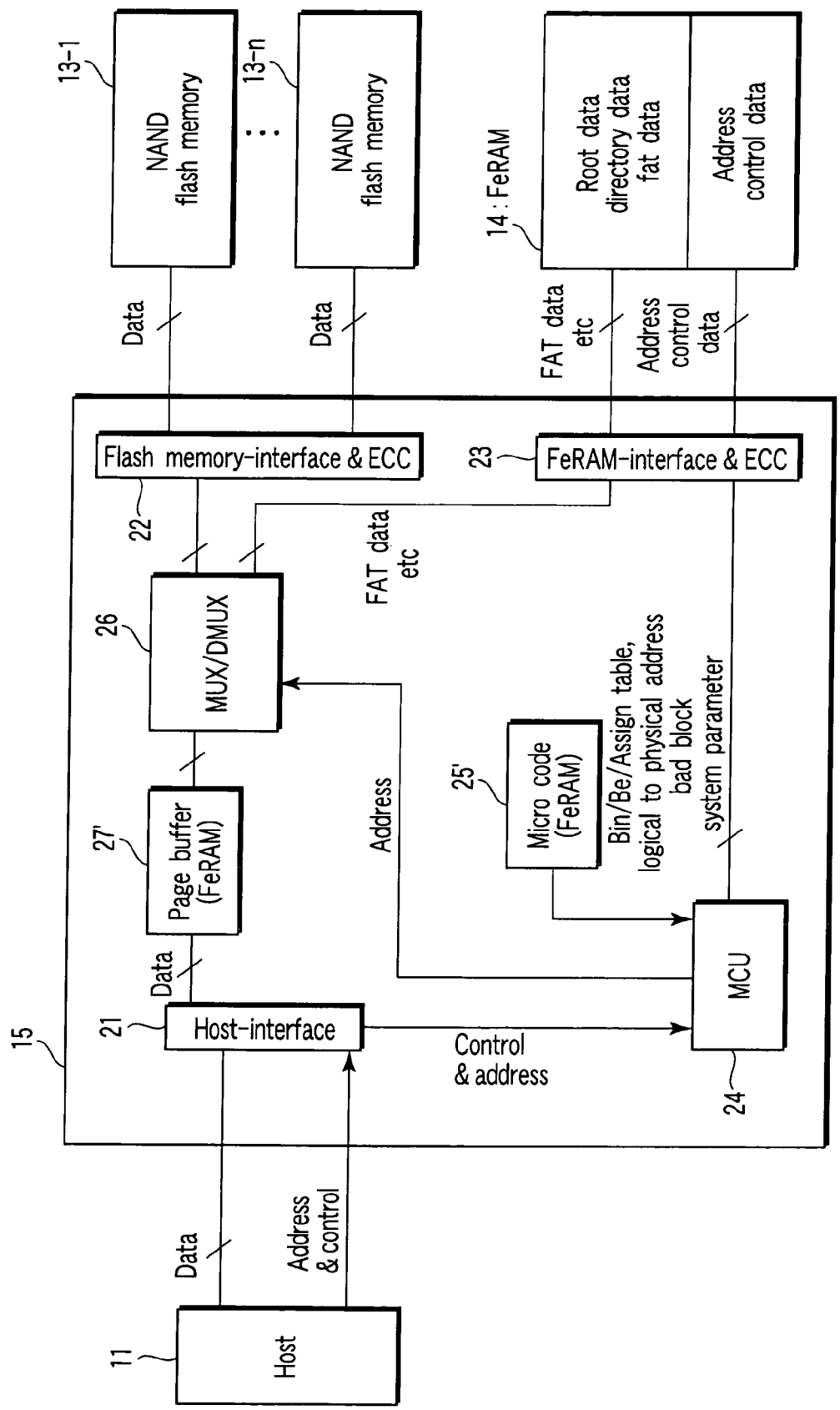
FIG. 12 is a block diagram showing a memory system according to the third embodiment of the present invention.

FIG. 12 is a block diagram showing a memory system according to the third embodiment of the present invention. The structure and effects are substantially the same as in FIG. 11, and the difference is that a page buffer 27' and micro code memory 25' are ferroelectric memories.

When the page buffer 27' is formed by a ferroelectric memory, data can be held in the buffer 27' even when the power supply is shut down the moment the data enters the buffer 27'. Therefore, the data write speed can be further increased. Also, when the micro code memory 25' is formed by a ferroelectric memory, micro codes can be changed easily, so it is unnecessary to redesign or refabricate the memory.

Fourth Embodiment

Figure 13:
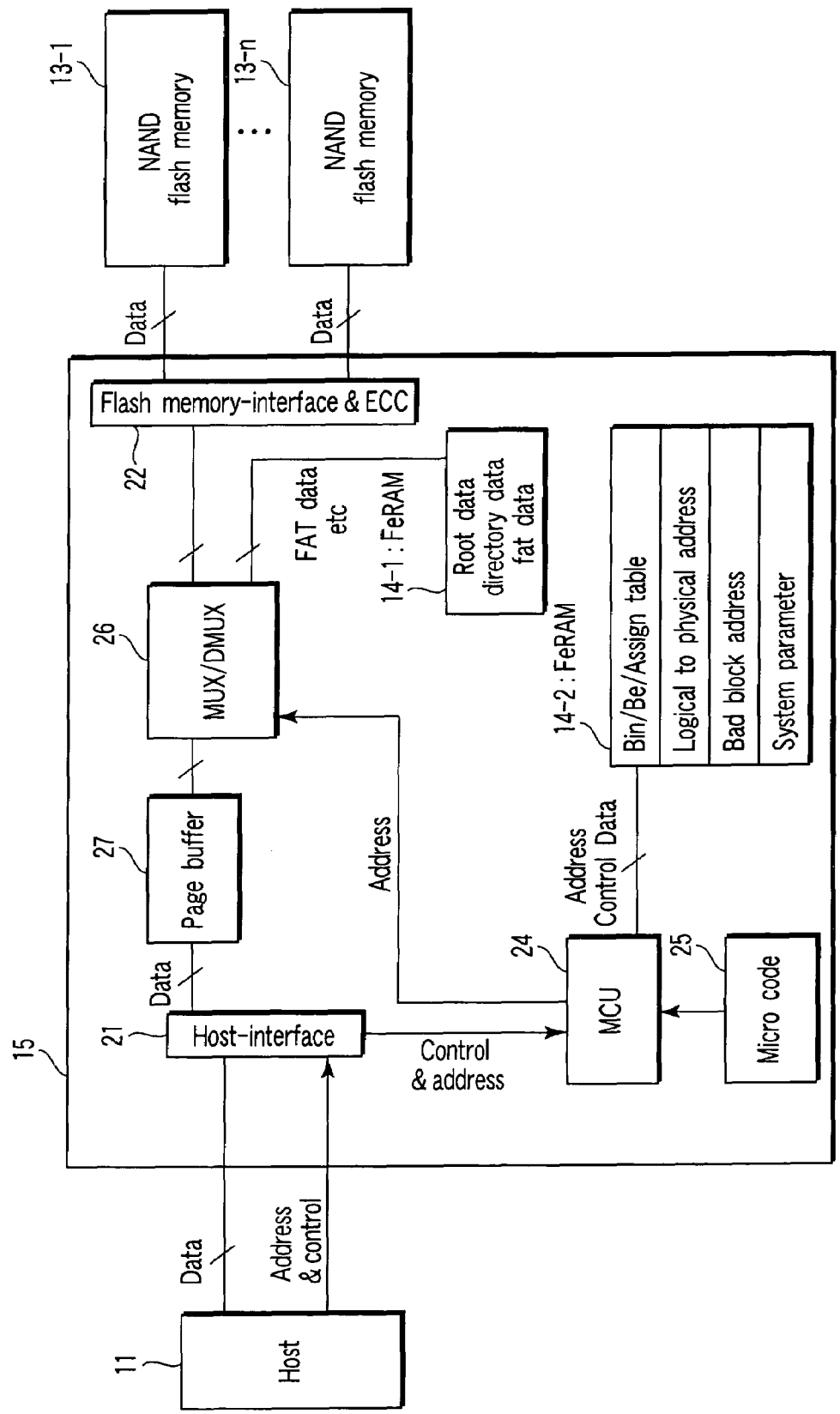
FIG. 13 is a block diagram showing a memory system according to the fourth embodiment of the present invention.

FIG. 13 is a block diagram showing a memory system according to the fourth embodiment of the present invention. The structure and effects are substantially the same as in FIG. 11, and the difference is that all ferroelectric memories 14 (14-1 and 14-2) are incorporated into a controller 15.

Since the ferroelectric memories 14-1 and 14-2 are formed only by adding ferroelectric caps to the conventional CMOS process, the embedding process is easy. Therefore, the cost can be reduced by an embedded ferroelectric memory if the capacity is small. This is not limited to the various embodiments of the present invention. That is, in the configuration of a memory system, various blocks can be formed into one chip or freely combined.

Fifth Embodiment

Figure 14:
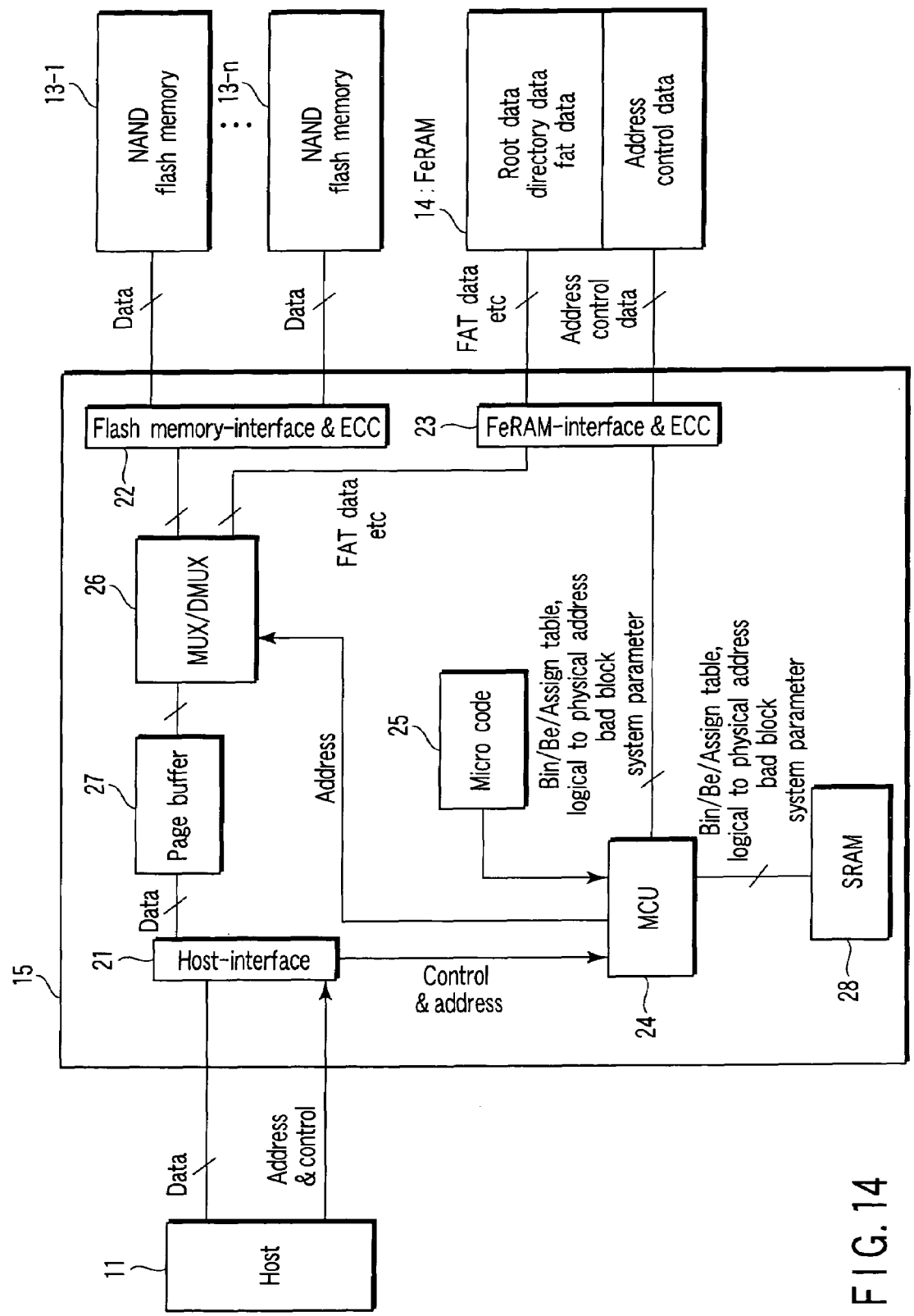
FIG. 14 is a block diagram showing a memory system according to the fifth embodiment of the present invention.

FIG. 14 is a block diagram showing a memory system according to the fifth embodiment of the present invention. The structure and effects are substantially the same as in FIG. 11, and the difference is that an SRAM 28 for temporarily storing system information is incorporated into a controller 15.

When a memory system is operated at a high speed, the operating speed of a ferroelectric memory (FeRAM) is slightly lower than that of an SRAM. Therefore, it is possible to load the system information of a ferroelectric memory 14 into the SRAM 28 upon power-on, and, if the contents are changed, write the changed portion back to the ferroelectric memory 14.

Sixth Embodiment

Figure 15:
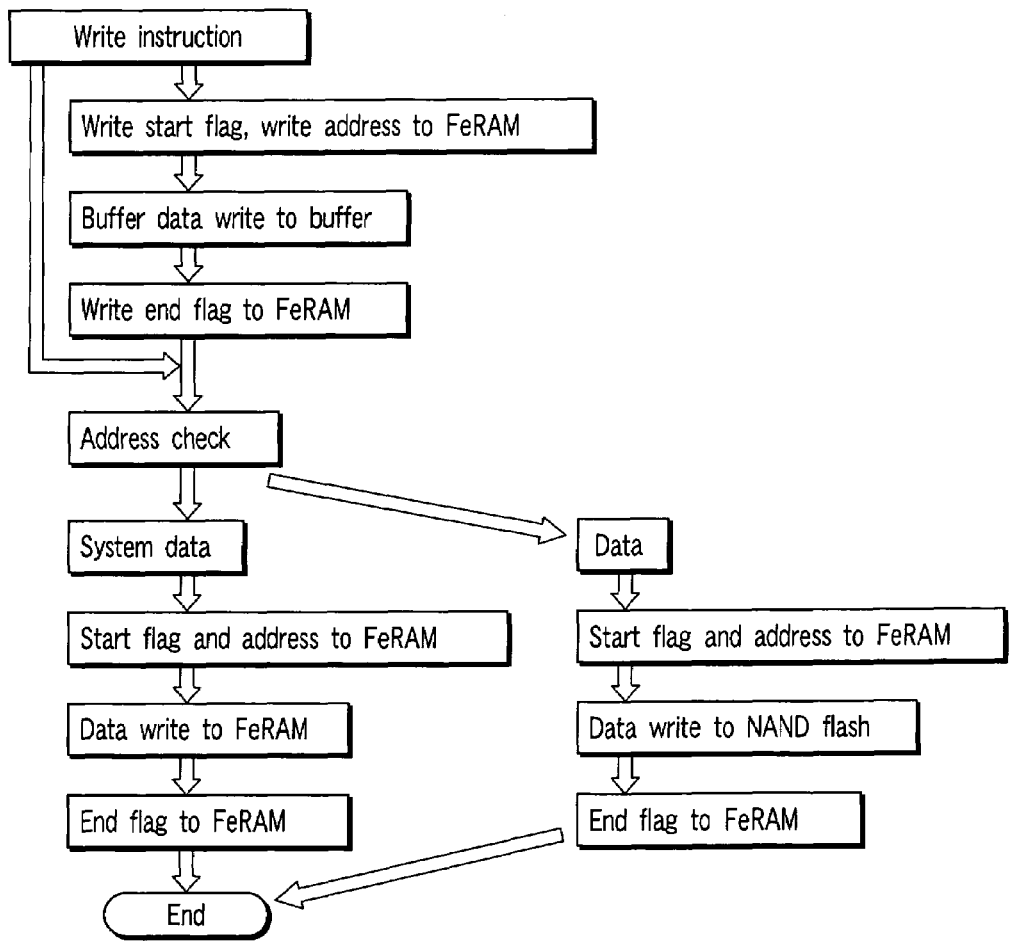
FIG. 15 is a diagram showing the algorithm of a write operation of a memory system according to the sixth embodiment of the present invention.

FIG. 15 shows the algorithm of a write operation in a memory system according to the sixth embodiment of the present invention. This algorithm can be applied to all the circuits shown in FIGS. 10 to 14, and to another arrangement.

When a write instruction is input to a memory system in which a buffer is formed by a ferroelectric memory, the write operation is completed when a flag indicating the end of write to the buffer is stored in the ferroelectric memory. This makes it possible to take a measure to cope with an instantaneous power failure, and improve the apparent write performance.

In addition, in the case of an SRAM, data may also be directly written in a ferroelectric memory without using any buffer. In this case, even if the power supply is turned off in the middle of write to a flash EEPROM, the write operation can be continued when the power supply is turned on again as long as a write flag is ON. Also, the performance improves if a write flag to the flash EEPROM is stored in the ferroelectric memory.

Seventh Embodiment

FIG. 16 is a block diagram showing a memory system according to the seventh embodiment of the present invention. The arrangement is similar to FIG. 13 and achieves the same effect as in FIG. 13. This memory system includes NAND flash EEPROMs 13-1, ..., 13-n, and a controller 15 incorporating a ferroelectric memory. The controller 15 comprises an interface circuit 21 which interfaces with a host apparatus 11, an interface circuit 22 which interfaces with the NAND flash EEPROMs 13-1, ..., 13-n, an MCU 24 which controls the whole of the controller 15 and the NAND flash EEPROMs 13-1, ..., 13-n, a micro code memory 25 for storing instruction codes and the like of the MCU 24, a ferroelectric memory 14 for storing various data and system information, and a write-back buffer 29 formed by a ferroelectric memory. The write-back buffer 29 is used to write data from the ferroelectric memory 14 into the flash EEPROMs 13-1, ..., 13-n, or write data from a page buffer 27 into the flash EEPROMs 13-1, ..., 13-n.

The functions and effects of the ferroelectric memory will be explained below.

First, when data is to be actually stored in the flash EEPROMs 13-1, ..., 13-n under the control of the MCU 24, the data is once written in the ferroelectric memory 14, and a write start flag Bin and write end flag Be are written in the ferroelectric memory 14. Since the data write viewed from outside the memory system is completed, the apparent write performance improves. By storing the write information in the flash EEPROMs 13-1, ..., 13-n after or simultaneously with this operation, it is possible to take a measure to cope with an instantaneous power failure as in the circuit shown in FIG. 10.

Second, when data is to be actually stored in the flash EEPROMs 13-1, . . . , 13-n under the control of the MCU 24, system information such as a logical-physical converted address indicating the relationship between the physical address of the block position and page position and the actual logical address and the information of the start and end of write to the flash EEPROMs 13-1, . . . , 13-n are also written in the ferroelectric memory 14. Since these pieces of system information can be rapidly written, most of the processing time is the data write time, so the effective write performance improves.

Third, when bad block information and system parameters of the flash EEPROMs 13-1, . . . , 13-n are also written in the ferroelectric memory 14 (14-2), the number of times of access to the flash EEPROMs 13-1, . . . , 13-n which operate slowly reduces, and this increases the processing speed. In addition, when logical-physical converted address information and bad block information are stored in the ferroelectric memory 14 (14-2), a physical address in the flash EEPROMs 13-1, . . . , 13-n which corresponds to the logical address is found immediately after the power supply of the memory system is turned on. This makes high-speed power-on feasible.

Fourth, the ferroelectric memory 14 can also be handled as a nonvolatile cache. That is, a certain data area is secured in the ferroelectric memory 14. In a read operation, data is copied from the flash EEPROMs 13-1, . . . , 13-n to the ferroelectric memory 14, and this information is read out from the memory system at the same time.

Since the once read logical address information is already stored in the ferroelectric memory 14, this information is read at a high speed from the second time. In this case, the addresses of the flash EEPROMs 13-1, . . . , 13-n are stored as tag information in the ferroelectric memory 14. The ferroelectric memory 14 also stores a used page which indicates whether the memory space is used.

To write the once read address information from outside the memory system, the write operation is apparently completed only by writing the information in the ferroelectric memory 14. In this case, however, the data values of the ferroelectric memory 14 are different from those of the flash EEPROMs 13-1, . . . , 13-n, so a dirty page flag is set. If the use ratio of the area of the ferroelectric memory 14 increases, the data values are written from the ferroelectric memory 14 back to the flash EEPROMs 13-1, . . . , 13-n via the write-back buffer 29.

Since transfer from the ferroelectric memory 14 to the write-back buffer 29 is performed at a high speed due to the presence of the write back buffer, read/write to the area of the ferroelectric memory 14 can be performed while the data is slowly written from the write-back buffer 29 back to the flash EEPROMs 13-1, . . . , 13-n, so the processing speed can be increased. This write-back from the ferroelectric memory 14 to the flash EEPROMs 13-1, . . . , 13-n is started from data having a low access frequency. Therefore, the ferroelectric memory 14 has a counter memory for storing the access count.

With this cache function, system information for storing data which is expected to be frequently accessed always resides on the ferroelectric memory, so substantially the same effects as in FIG. 13 can be achieved. The system information is, e.g., root information, directory information, the file name of the data, the file size of the data, file allocation table (FAT) information storing the storage location of the data, or write completion time information of the data.

The system information and the data to be frequently accessed may also be held in the ferroelectric memory 14 by combining this memory system and FIG. 13. In the memory system as a whole, when read/write to the memory system is repeated, data to be frequently accessed is held in the ferroelectric memory, and the flash EEPROMs are not accessed, so the performance greatly improves. Especially, when the OS frequently accesses the memory by a small file unit as in a PC, the improvement in performance is remarkable.

Eighth Embodiment

Figure 17:
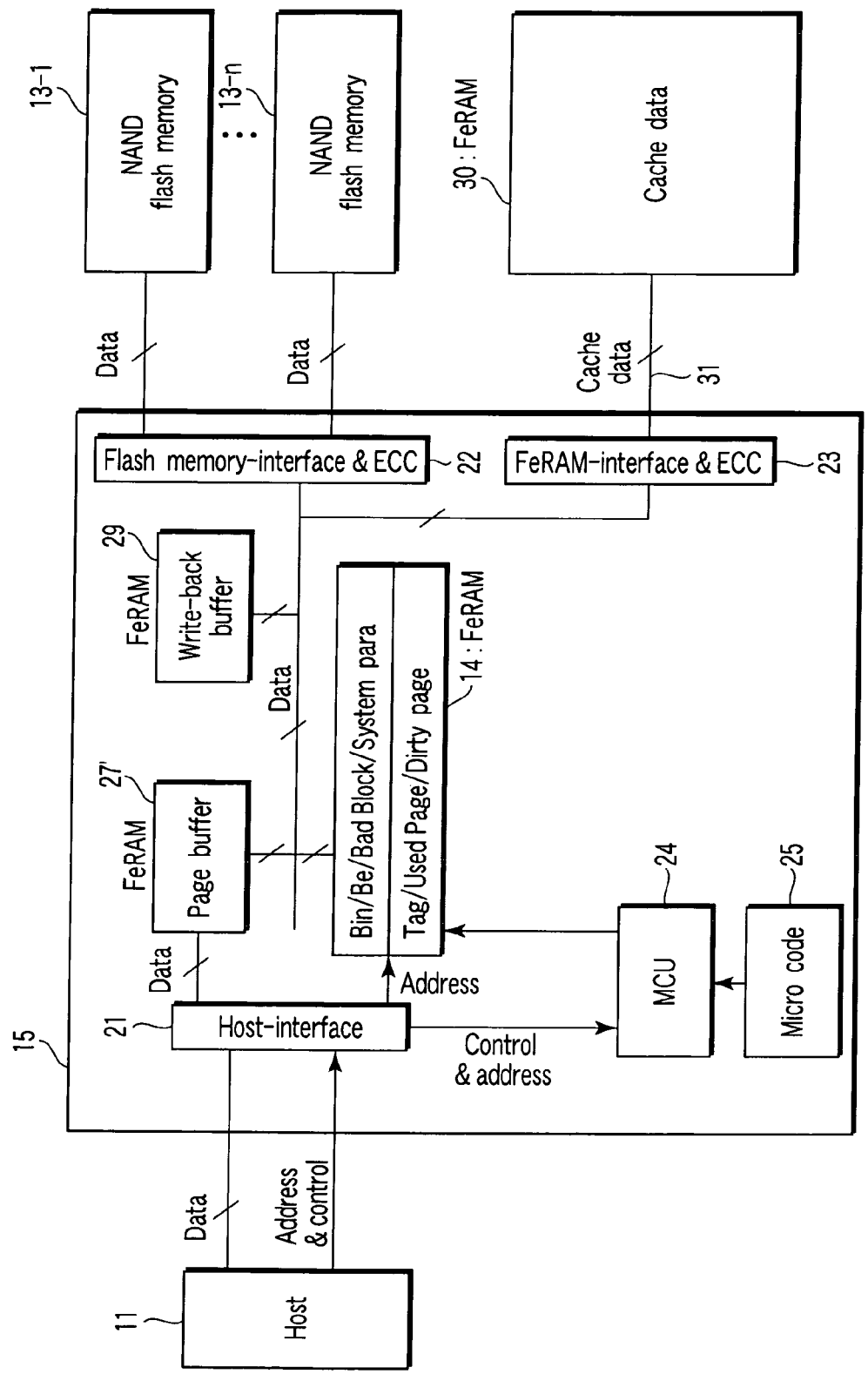
FIG. 17 is a block diagram showing a memory system according to the eighth embodiment of the present invention.

FIG. 17 is a block diagram showing a memory system according to the eighth embodiment of the present invention. The arrangement is substantially the same as in FIG. 16, and the effect is also the same as in FIG. 16. The difference is that the data area of a cache having a relatively large capacity is formed by an external ferroelectric memory 30. This decreases the cost, if a large cache is necessary, compared to a case in which only a ferroelectric memory 14 is embedded. To maintain the same performance as in FIG. 16, a controller 15 and the external ferroelectric memory 30 must be connected by a bus 31 having a relatively wide band. This poses no problem because the read/write energy per bit of a ferroelectric memory is small, so a large number of bits can be read or written at once.

Ninth Embodiment

Figure 18:
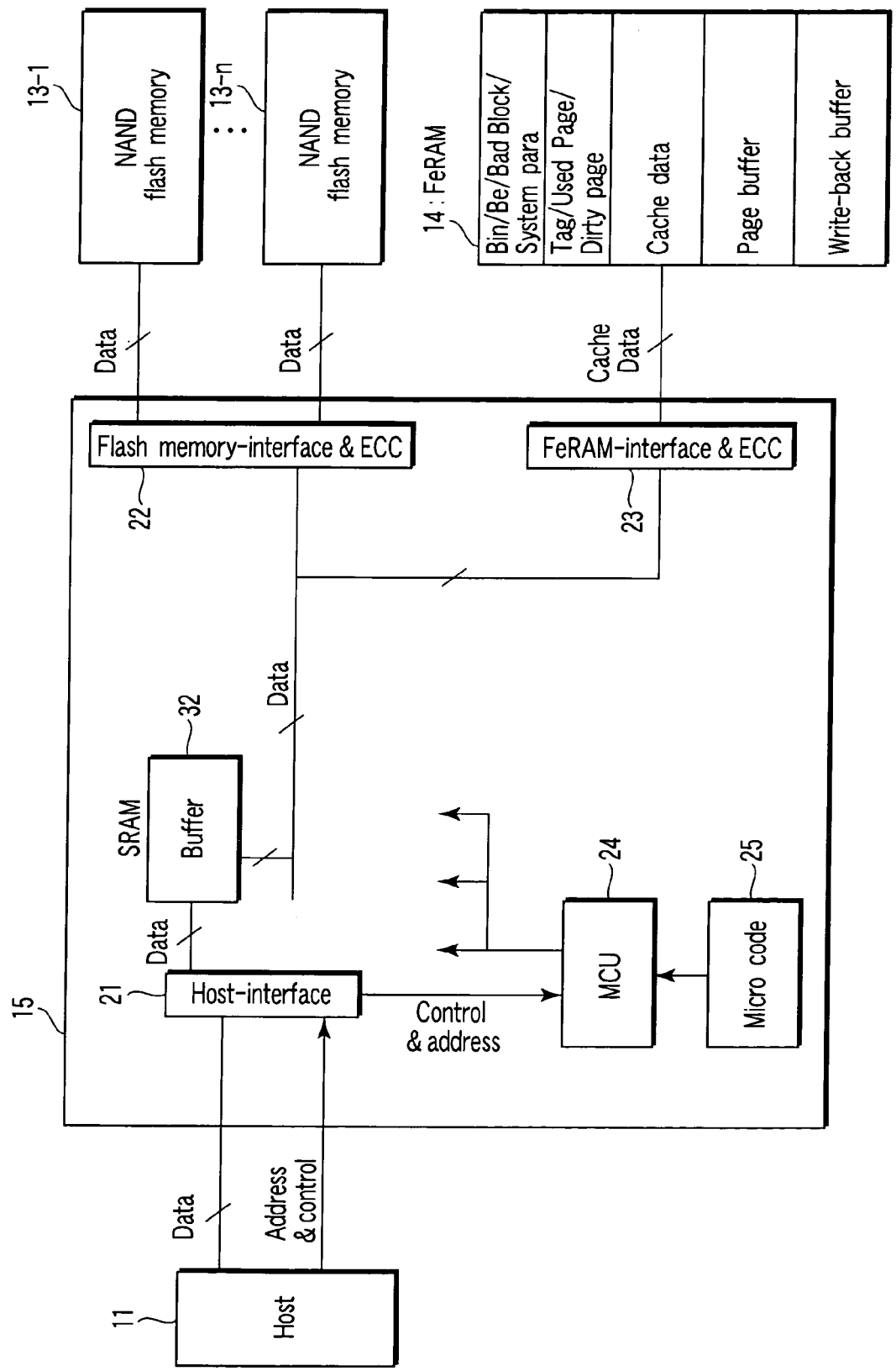
FIG. 18 is a block diagram showing a memory system according to the ninth embodiment of the present invention.

FIG. 18 is a block diagram showing a memory system according to the ninth embodiment of the present invention. The arrangement is substantially the same as in FIG. 16, and the effect is also the same as in FIG. 16. The difference is that a memory 14 which is entirely formed by a ferroelectric memory is externally attached to a controller 15. Also, a page buffer is formed by an SRAM 32.

10th Embodiment

Figure 19:
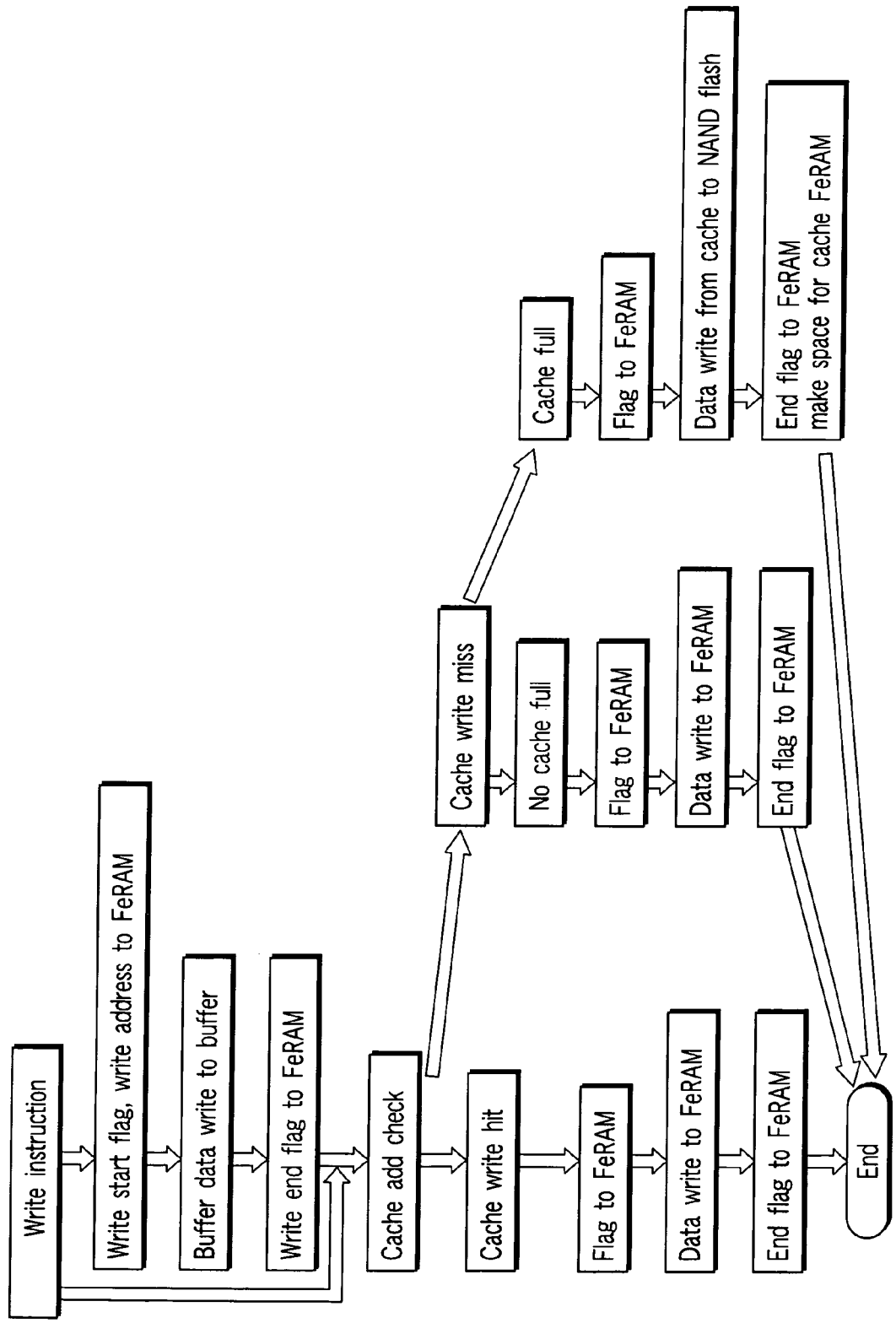
FIG. 19 is a diagram showing the algorithm of a write operation of a memory system according to the 10th embodiment of the present invention.

FIG. 19 shows the algorithm of a write operation in a memory system according to the 10th embodiment of the present invention. This algorithm can be applied to all the circuits shown in FIGS. 16 to 18, and to another arrangement.

When a write instruction is input to a memory system in which a buffer is formed by a ferroelectric memory, the write operation is completed when a write end flag to the buffer is stored in the ferroelectric memory. This makes it possible to take a measure to cope with an instantaneous power failure, and improve the apparent write performance.

In addition, in the case of an SRAM, data may also be moved without using the buffer. If data to be stored already exists on the ferroelectric memory side, the data is written in the cache of the ferroelectric memory; if not, the data is written in a free space of the ferroelectric memory. If there is no more free space, data having a low access frequency may also be once copied to a write buffer, and slowly written in the flash EEPROM after that. The difference from a normal cache is that at least a write end flag is written in the management area of the ferroelectric memory during write to the buffer, write to the cache of the ferroelectric memory, write to the write buffer, and write to the flash EEPROM.

It is of course also possible to write a write start flag. In this case, the power supply can be turned off any time. The point is that when data is to be moved between the individual memories, after data in the source of the move is copied to the destination of the move, the end flag of the destination of the move is set, and the start flag of the source of the move is canceled, thereby completing the move. When this move is repeated between the host and memory system and between the buffer, ferroelectric memory, and flash EEPROM in the memory system, the power supply can be turned off any time. A problem arises if the power supply is shut down while the flag is being turned on or off. However, the write cycle time of the ferroelectric memory is about 20 to 100 ns, so a stabilization cap which holds the power supply for this time period need only be used.

Data may also be directly written in the ferroelectric memory. In this case, even if the power supply is turned off in the middle of write to the flash EEPROM, the write operation can be continued when the power supply is turned on again as long as a write flag is ON. Also, the performance improves if a write flag to the flash EEPROM is stored in the ferroelectric memory.

11th Embodiment

Figure 20:
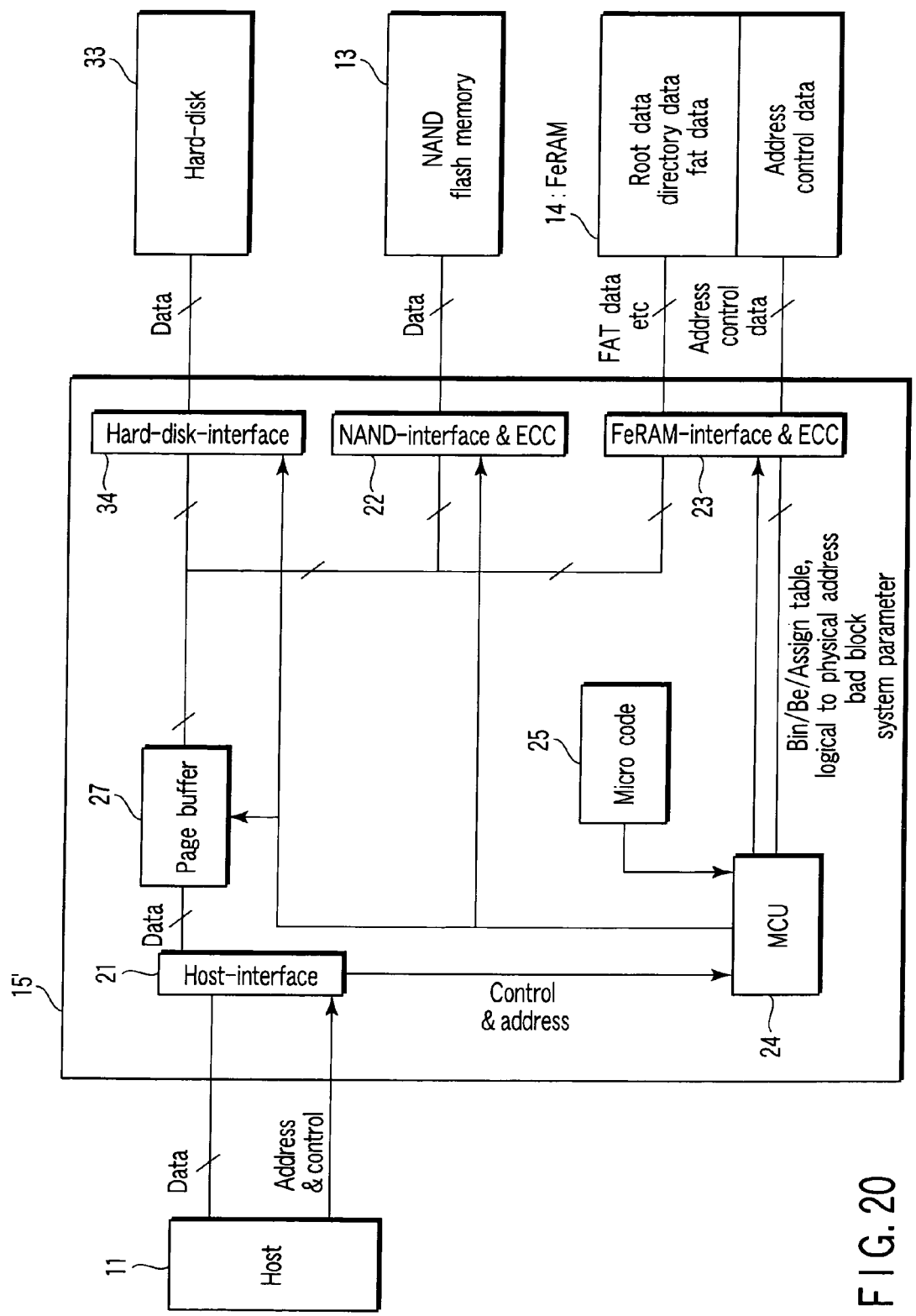
FIG. 20 is a block diagram showing a memory system according to the 11th embodiment of the present invention.

FIG. 20 is a block diagram showing a memory system according to the 11th embodiment of the present invention. The arrangement and effects are substantially the same as in FIGS. 10 to 19. The difference is that the memory system includes a hard disk drive (Hard-Disk) 33 and an interface circuit (Hard-Disk Interface) 34 which interfaces with the hard disk drive 33, in addition to a controller 15', ferroelectric memory 14, and flash EEPROM 13.

The hard disk drive 33 is an apparatus which magnetically reads and writes data by moving a head close to a magnetic rotary disk. The head requires a seek time of a few to ten-odd ms in order to move to a desired position, and the rotary disk also takes a long time to rotate once. As a consequence, the average waiting time requires a half rotation which takes a few ms.

Accordingly, the start time of read/write is long, and this deteriorates the performance of read/write of a small file. Therefore, it is desirable to combine the hard disk drive 33 and ferroelectric memory 14, thereby storing a system area in the ferroelectric memory 14 and a data area in the hard disk drive 33. It is also desirable to copy files to be frequently accessed to the ferroelectric memory. In short, the read/write speed decreases in the order of the ferroelectric memory 14, flash EEPROM 13, and hard disk drive 33. The cost per bit of the hard disk drive 33 is much lower than that of the flash EEPROM 13. Therefore, it is desirable to store system information in the ferroelectric memory 14, an OS in the flash EEPROM 13, and data in the hard disk drive 33. It is possible by optimally dividing these memories into areas to increase the capacity and speed of a PC or the like, and realize fast PC initialization.

Also, the effects described so far can be achieved even when the ferroelectric memory 14 and hard disk drive 33 alone are used.

12th Embodiment

Figure 21:
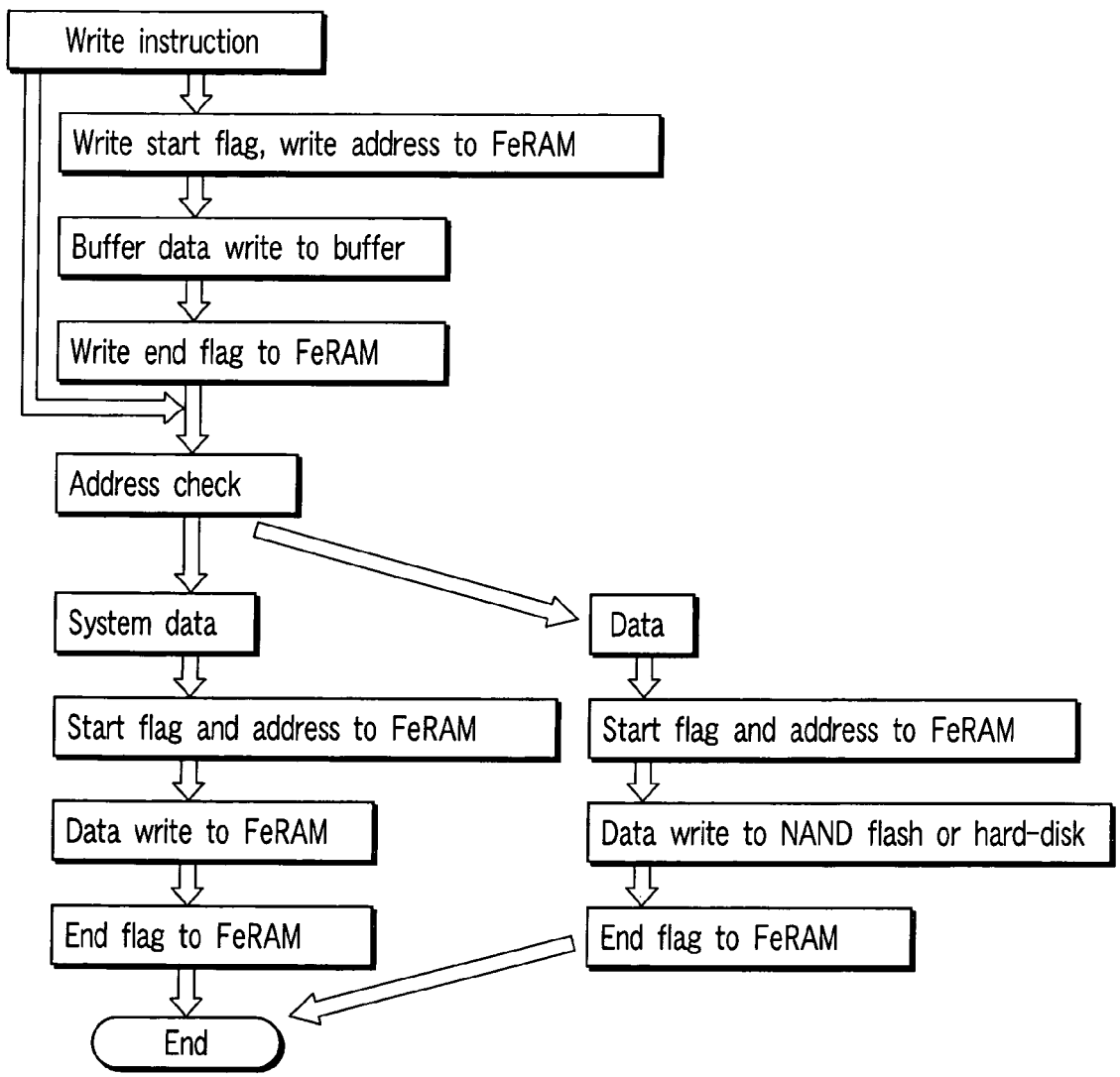
FIG. 21 is a diagram showing the algorithm of a write operation of a memory system according to the 12th embodiment of the present invention.

FIG. 21 shows the algorithm of a write operation in a memory system according to the 12th embodiment of the present invention. This algorithm is applicable to the circuit shown in FIG. 21, and to another arrangement.

13th Embodiment

Figure 22:
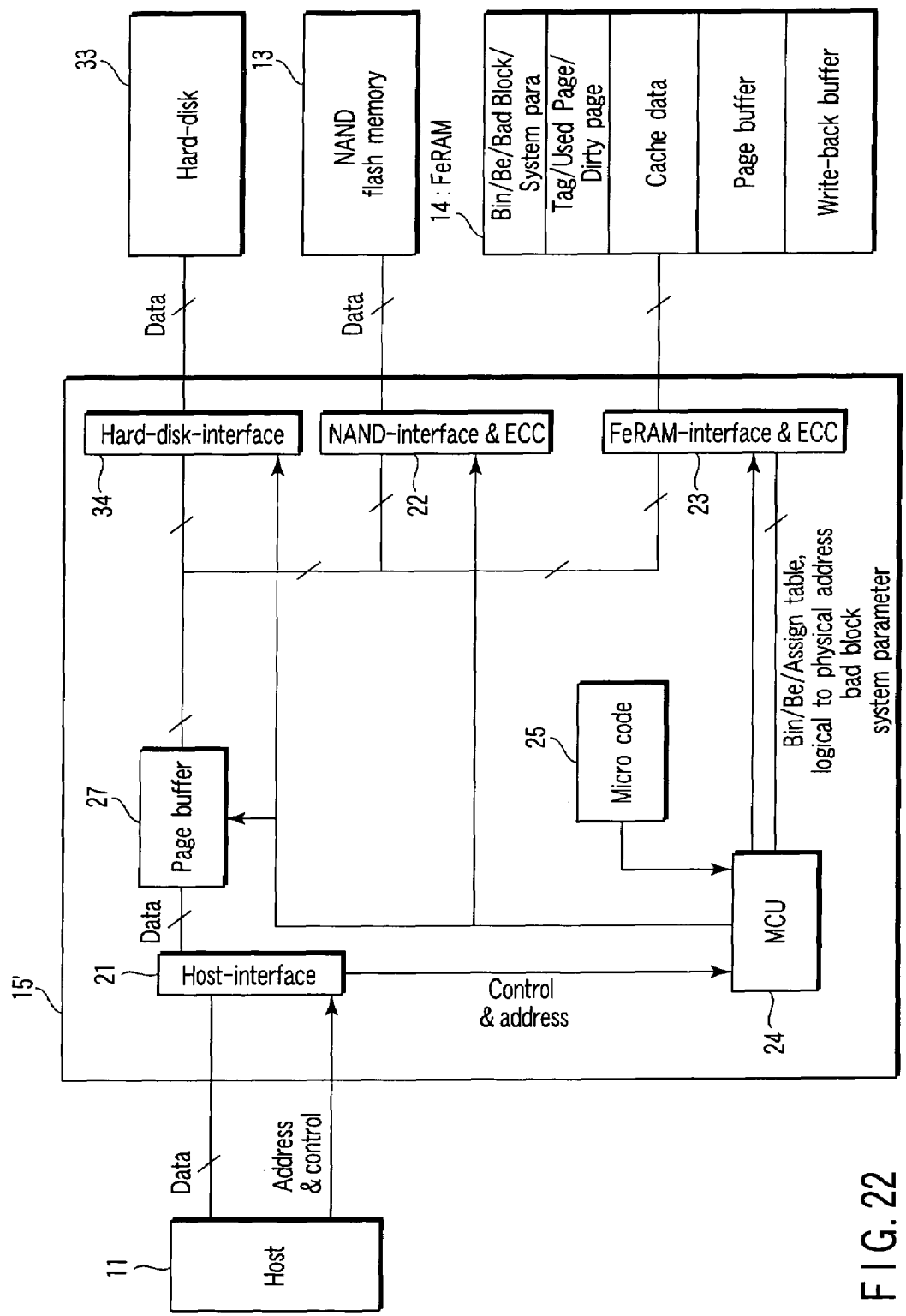
FIG. 22 is a block diagram showing a memory system according to the 13th embodiment of the present invention.

FIG. 22 is a block diagram showing a memory system according to the 13th embodiment of the present invention. This memory system has three types of memories, i.e., a ferroelectric memory 14, flash EEPROM 13, and hard disk drive 33, and a cache function is added to the ferroelectric memory 14. The effects are the same as in, e.g., FIG. 16. The addition of the hard disk drive 33 makes it possible to optimally separate system information, system data, user data, and the like more finely.

14th Embodiment

FIG. 23 shows the algorithm of a write operation in a memory system according to the 14th embodiment of the present invention. This algorithm is applicable to the circuit shown in FIG. 21, and to another arrangement.

15th Embodiment

Figure 24:
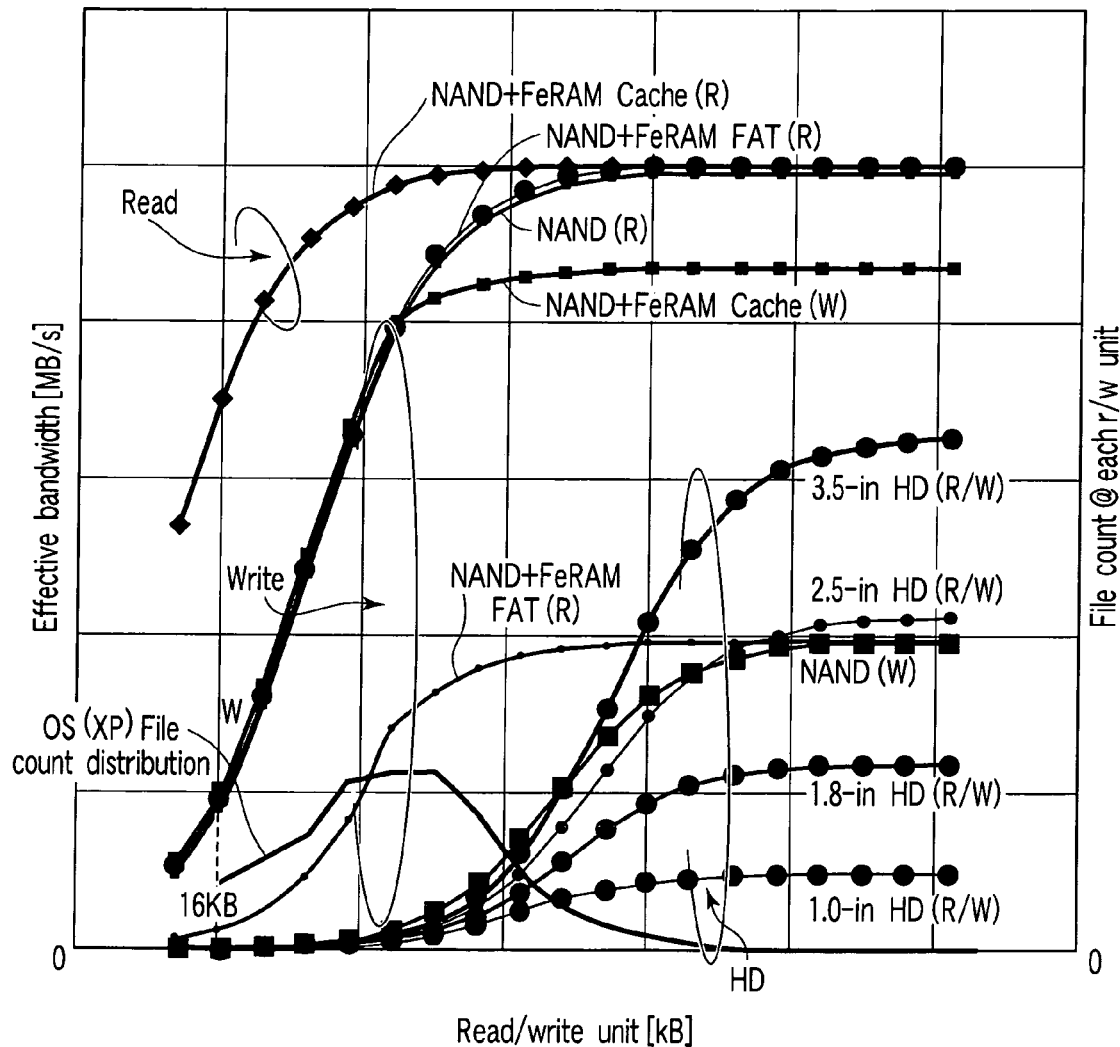
FIG. 24 is a graph showing the relationship between the file size unit and bandwidth of a memory system to which the first to 14th embodiments of the present invention are applied.

FIG. 24 shows a practical example showing the effects of the present invention. The abscissa indicates the file size unit when read/write is performed, and the ordinate indicates the effective read/write bandwidth.

When a hard disk (HD in FIG. 24) is used alone, the bandwidth is large for both read and write if a file size is large. If a file size is small, however, the performance largely deteriorates due to the seek time and rotation waiting time.

Similarly, when a flash EEPROM (NAND in FIG. 24) is used alone, the effective write bandwidth increases if the page unit of programming is increased, and the effective read bandwidth increases if the bandwidth of IO is increased. If a file size is small, however, particularly the write bandwidth decreases because it takes a long time to write system information such as FAT information, and this largely degrades the performance.

By contrast, when system information is given to a ferroelectric memory and data is given to a flash EEPROM (NAND+FeRAM FAT in FIG. 24) as in the present invention, the write performance can be maintained even if a file size is small. In addition, when a nonvolatile cache for flag information pairs is formed by a ferroelectric memory and combined with a flash EEPROM (NAND+FeRAM Cache in FIG. 24), the write performance greatly improves. The read performance also improves by the cache.

On the other hand, the OS (XP) file count distribution indicates the file size distribution in the OS portion of Windows XP (registered trademark). When the performance is evaluated by the peak point of a file size, the performance of the system of the present invention is a few times to a few ten times as high as those of the conventional flash EEPROM memory system and hard disk system. This shows that the OS operation of a mobile apparatus dramatically improves.

Accordingly, the first to 15th embodiments described above can provide a memory system capable of increasing the read/write speed while suppressing the rise in cost.

Outlines of Embodiments

That is, the individual embodiments of the present invention use the following arrangements.

The first form of the present invention is a memory system characterized by comprising a ferroelectric memory formed by arranging a plurality of memory cells each comprising a ferroelectric capacitor and cell transistor, a flash EEPROM formed by arranging a plurality of memory cells each having a floating gate and capable of electrically erasing and writing data, a control circuit which controls the ferroelectric memory and flash EEPROM, and an interface circuit which communicates with the outside, wherein the flash EEPROM stores data, and the ferroelectric memory stores root information for storing the data, directory information, the file name of the data, the file size of the data, file allocation table information storing the storage location of the data, or the write completion time of the data.

The second form of the present invention is a memory system characterized by comprising a ferroelectric memory formed by arranging a plurality of memory cells each comprising a ferroelectric capacitor and cell transistor, a flash EEPROM formed by arranging a plurality of memory cells each having a floating gate and capable of electrically erasing and writing data, a control circuit which controls the ferroelectric memory and flash EEPROM, and an interface circuit which communicates with the outside, wherein the flash EEPROM stores data, and the ferroelectric memory stores a logical-physical converted address indicating the relationship between the physical address of a block position and page position where the data is actually stored in the flash EEPROM and the actual logical address.

The third form of the present invention is a memory system characterized by comprising a ferroelectric memory formed by arranging a plurality of memory cells each comprising a ferroelectric capacitor and cell transistor, a flash EEPROM formed by arranging a plurality of memory cells each having a floating gate and capable of electrically erasing and writing data, a control circuit which controls the ferroelectric memory and flash EEPROM, and an interface circuit which communicates with the outside, wherein the control circuit or ferroelectric memory stores information which defines areas of a logical address space which are to be stored in the flash EEPROM and ferroelectric memory.

The fourth form of the present invention is a memory system characterized by comprising a ferroelectric memory formed by arranging a plurality of memory cells each comprising a ferroelectric capacitor and cell transistor, a flash EEPROM formed by arranging a plurality of memory cells each having a floating gate and capable of electrically erasing and writing data, a control circuit which controls the ferroelectric memory and flash EEPROM, and an interface circuit which communicates with the outside, wherein the flash EEPROM stores data, and the ferroelectric memory stores flag information indicating that actual recording of the data into the flash EEPROM is started, or flag information indicating that actual recording of the data into the flash EEPROM is completed.

The fifth form of the present invention is a memory system characterized by comprising a ferroelectric memory formed by arranging a plurality of memory cells each comprising a ferroelectric capacitor and cell transistor, a flash EEPROM formed by arranging a plurality of memory cells each having a floating gate and capable of electrically erasing and writing data, a control circuit which controls the ferroelectric memory and flash EEPROM, and an interface circuit which communicates with the outside, wherein the flash EEPROM stores data, and the ferroelectric memory stores a flag indicating whether each page or each block of the flash EEPROM is used, and a flag indicating whether each page or each block of the flash EEPROM is unusable.

The sixth form of the present invention is a memory system characterized by comprising a ferroelectric memory formed by arranging a plurality of memory cells each comprising a ferroelectric capacitor and cell transistor, a flash EEPROM formed by arranging a plurality of memory cells each having a floating gate and capable of electrically erasing and writing data, a control circuit which controls the ferroelectric memory and flash EEPROM, and an interface circuit which communicates with the outside, wherein when data write is designated from outside the memory system, a write start flag, write data, a write address, and a write end flag to the ferroelectric memory are written in the ferroelectric memory, and then the data is written in the flash EEPROM, and a write start flag, write data, a write address, and a write end flag to the flash EEPROM are written in the ferroelectric memory.

The seventh form of the present invention is a memory system characterized by comprising a ferroelectric memory formed by arranging a plurality of memory cells each comprising a ferroelectric capacitor and cell transistor, a flash EEPROM formed by arranging a plurality of memory cells each having a floating gate and capable of electrically erasing and writing data, a control circuit which controls the ferroelectric memory and flash EEPROM, and an interface circuit which communicates with the outside, wherein when data write is designated from outside the memory system, a write end flag to the ferroelectric memory is written in the ferroelectric memory, and then a write end flag to the flash EEPROM is written in the ferroelectric memory.

The eighth form of the present invention is a memory system characterized by comprising a ferroelectric memory formed by arranging a plurality of memory cells each comprising a ferroelectric capacitor and cell transistor, a flash EEPROM formed by arranging a plurality of memory cells each having a floating gate and capable of electrically erasing and writing data, a control circuit which controls the ferroelectric memory and flash EEPROM, and an interface circuit which communicates with the outside, wherein data having the same logical address is permitted to be stored in the flash EEPROM and ferroelectric memory, and the ferroelectric memory stores flag 1 indicating the permission of the storage, flag 2 information indicating whether the contents of data stored in the same logical address of the flash EEPROM and ferroelectric memory are the same or different, information of the logical address, and a physical address to be stored in the flash EEPROM.

The ninth form of the present invention is characterized by combining the eighth and ninth forms, and is a memory system described in the eighth form, characterized in that when a read instruction is input to the memory system from outside the memory system, data in the ferroelectric memory is read outside the memory system if flag 1 indicates permission and flag 2 indicates sameness.

The 10th form of the present invention is characterized by combining the eighth and 10th forms, and is a memory system described in the eighth form, characterized in that when a write instruction is input to the memory system from outside the memory system, data is written in the ferroelectric memory while flag 2 is changed to indicate sameness and indicate differentness.

The 11th form of the present invention is characterized by combining the eighth and 11th forms, and is a memory system described in the eighth form, characterized in that if the memory space of the ferroelectric memory has no predetermined free area, data in the logical address for which the flag 2 information indicates differentness is moved from the ferroelectric memory to the flash EEPROM, and information of flag 1 is changed to indicate no permission, thereby forming an unused space in the ferroelectric memory.

The 12th form of the present invention is characterized by combining the first to eighth forms and the 12th form, and is a memory system described in any one of the first to eighth forms, characterized in that the ferroelectric memory has an arrangement in which one memory cell is formed by connecting one terminal of the ferroelectric capacitor to the source terminal of the cell transistor, and the other terminal of the ferroelectric capacitor to the drain terminal of the cell transistor, and a plurality of memory cells are connected in series, and the flash EEPROM has an arrangement in which memory cells each having a floating gate and capable of electrically erasing and writing data are connected in series.

The 13th form of the present invention is characterized by combining the first to eighth forms and the 13th form, and is a memory system described in any one of the first to eighth forms, characterized in that the ferroelectric memory has an arrangement in which one terminal of the ferroelectric capacitor is connected to the source terminal of the cell transistor, the other terminal of the ferroelectric capacitor is connected to a plate line, and the drain of the cell transistor is connected to a bit line, and the flash EEPROM has an arrangement in which memory cells each having a floating gate and capable of electrically erasing and writing data are connected in series.

The 14th form of the present invention is characterized by combining the first to eighth forms and the 14th form, and is a memory system described in any one of the first to eighth forms, characterized in that the ferroelectric memory has an arrangement in which one terminal of the ferroelectric capacitor is connected to the source terminal of the cell transistor, a plurality of obtained circuits are connected in parallel to form a cell block, a reset transistor is connected in parallel to the cell block, one terminal of the cell block is connected to a plate line, and the other terminal of the cell block is connected to a bit line via a block select transistor, and the flash EEPROM has an arrangement in which memory cells each having a floating gate and capable of electrically erasing and writing data are connected in series.

The 15th form of the present invention is characterized by combining the first to eighth forms and the 15th form, and is a memory system described in any one of the first to eighth forms, characterized in that the control circuit comprises one or more of an MCU, a micro code memory which is formed by an MROM or ferroelectric memory and controls the MCU, a buffer memory which is formed by an SRAM or ferroelectric memory in an external interface portion of the memory system and exchanges data with the outside, an ECC circuit which corrects an error of data from the flash EEPROM, and an ECC circuit which corrects an error of data from the ferroelectric memory.

The 16th form of the present invention is characterized by combining the first to sixth forms and the 16th form, and is a memory system described in any one of the first to sixth forms, characterized in that when data write is designated from outside the memory system, a write end flag to the ferroelectric memory is written in the ferroelectric memory, and then a write end flag to the flash EEPROM is written in the ferroelectric memory.

The 17th form of the present invention is a memory system characterized by comprising a ferroelectric memory formed by arranging a plurality of memory cells each comprising a ferroelectric capacitor and cell transistor, a flash EEPROM formed by arranging a plurality of memory cells each having a floating gate and capable of electrically erasing and writing data, a hard disk drive which magnetically stores data, a control circuit which controls the ferroelectric memory, flash EEPROM and hard disk drive, and an interface circuit which communicates externally, wherein the flash EEPROM and hard disk store data, and the ferroelectric memory stores root information for storing the data, directory information, the file name of the data, the file size of the data, file allocation table information storing the storage location of the data, or the write completion time of the data.

The 18th form of the present invention is a memory system characterized by comprising a ferroelectric memory formed by arranging a plurality of memory cells each comprising a ferroelectric capacitor and cell transistor, a flash EEPROM formed by arranging a plurality of memory cells each having a floating gate and capable of electrically erasing and writing data, a hard disk drive which magnetically stores data, a control circuit which controls the ferroelectric memory, flash EEPROM and hard disk drive, and an interface circuit which communicates externally, wherein the flash EEPROM and hard disk store data, and the ferroelectric memory stores a logical-physical converted address indicating the relationship between the physical address of a block position and page position where the data is actually stored in the flash EEPROM, the physical address of, e.g., a sector and track of the hard disk, and the actual logical address.

The 19th form of the present invention is a memory system characterized by comprising a ferroelectric memory formed by arranging a plurality of memory cells each comprising a ferroelectric capacitor and cell transistor, a flash EEPROM formed by arranging a plurality of memory cells each having a floating gate and capable of electrically erasing and writing data, a hard disk drive which magnetically stores data, a control circuit which controls the ferroelectric memory, flash EEPROM and hard disk drive, and an interface circuit which communicates externally, wherein the control circuit or ferroelectric memory stores information which defines areas of a logical address space which are to be stored in the flash EEPROM, hard disk, and ferroelectric memory.

The 20th form of the present invention is a memory system characterized by comprising a ferroelectric memory formed by arranging a plurality of memory cells each comprising a ferroelectric capacitor and cell transistor, a flash EEPROM formed by arranging a plurality of memory cells each having a floating gate and capable of electrically erasing and writing data, a hard disk drive which magnetically stores data, a control circuit which controls the ferroelectric memory, flash EEPROM and hard disk drive, and an interface circuit which communicates externally, wherein the flash EEPROM and hard disk store data, and the ferroelectric memory stores flag information indicating that actual recording of the data into the flash EEPROM or hard disk is started, or flag information indicating that actual recording of the data into the flash EEPROM or hard disk is completed.

The 21st form of the present invention is a memory system characterized by comprising a ferroelectric memory formed by arranging a plurality of memory cells each comprising a ferroelectric capacitor and cell transistor, a flash EEPROM formed by arranging a plurality of memory cells each having a floating gate and capable of electrically erasing and writing data, a hard disk drive which magnetically stores data, a control circuit which controls the ferroelectric memory, flash EEPROM and hard disk drive, and an interface circuit which communicates externally, wherein the flash EEPROM stores data, the ferroelectric memory stores a flag indicating whether each page or each block of the flash EEPROM is used, and a flag indicating whether each page or each block of the flash EEPROM is unusable, the hard disk stores data, and the ferroelectric memory stores a flag indicating whether each track information or each sector information of the hard disk is used, and a flag indicating whether each track information or each sector information of the hard disk is unusable.

The 22nd form of the present invention is a memory system characterized by comprising a ferroelectric memory formed by arranging a plurality of memory cells each comprising a ferroelectric capacitor and cell transistor, a flash EEPROM formed by arranging a plurality of memory cells each having a floating gate and capable of electrically erasing and writing data, a hard disk drive which magnetically stores data, a control circuit which controls the ferroelectric memory, flash EEPROM and hard disk drive, and an interface circuit which communicates externally, wherein when data write is designated from outside the memory system, a write end flag to the ferroelectric memory is written in the ferroelectric memory, and then a write end flag to the flash EEPROM or hard disk is written in the ferroelectric memory.

The 23rd form of the present invention is a memory system characterized by comprising a ferroelectric memory formed by arranging a plurality of memory cells each comprising a ferroelectric capacitor and cell transistor, a flash EEPROM formed by arranging a plurality of memory cells each having a floating gate and capable of electrically erasing and writing data, a hard disk drive which magnetically stores data, a control circuit which controls the ferroelectric memory, flash EEPROM and hard disk drive, and an interface circuit which communicates externally, wherein data having the same logical address is permitted to be stored in the flash EEPROM or hard disk drive and the ferroelectric memory, and the ferroelectric memory stores flag 1 indicating the permission of the storage, flag 2 information indicating whether the contents of data stored in the same logical address of the flash EEPROM or hard disk drive and the ferroelectric memory are the same or different, information of the logical address, and a physical address to be stored in the flash EEPROM or hard disk.

The 24th form of the present invention is a memory system characterized by comprising a ferroelectric memory formed by arranging a plurality of memory cells each comprising a ferroelectric capacitor and cell transistor, a hard disk drive which magnetically stores data, a control circuit which controls the ferroelectric memory, flash EEPROM and hard disk drive, and an interface circuit which communicates externally, wherein the hard disk stores data, and the ferroelectric memory stores root information for storing the data, directory information, the file name of the data, the file size of the data, file allocation table information storing the storage location of the data, or the write completion time of the data.

The 25th form of the present invention is a memory system characterized by comprising a ferroelectric memory formed by arranging a plurality of memory cells each comprising a ferroelectric capacitor and cell transistor, a hard disk drive which magnetically stores data, a control circuit which controls the ferroelectric memory and the hard disk drive, and an interface circuit which communicates externally, wherein the hard disk stores data, and the ferroelectric memory stores a logical-physical converted address indicating the relationship between the physical address of a sector position and track position where the data is actually stored in the memory of the hard disk and the actual logical address.

The 26th form of the present invention is a memory system characterized by comprising a ferroelectric memory formed by arranging a plurality of memory cells each comprising a ferroelectric capacitor and cell transistor, a hard disk drive which magnetically stores data, a control circuit which controls the ferroelectric memory and the hard disk drive, and an interface circuit which communicates externally, wherein the control circuit or ferroelectric memory stores information which defines areas of a logical address space which are to be stored in the hard disk and ferroelectric memory.

The 27th form of the present invention is a memory system characterized by comprising a ferroelectric memory formed by arranging a plurality of memory cells each comprising a ferroelectric capacitor and cell transistor, a hard disk drive which magnetically stores data, a control circuit which controls the ferroelectric memory and the hard disk drive, and an interface circuit which communicates externally, wherein the hard disk stores data, and the ferroelectric memory stores flag information indicating that actual recording of the data into the hard disk is started, or flag information indicating that actual recording of the data into the hard disk is completed.

The 28th form of the present invention is a memory system characterized by comprising a ferroelectric memory formed by arranging a plurality of memory cells each comprising a ferroelectric capacitor and cell transistor, a hard disk drive which magnetically stores data, a control circuit which controls the ferroelectric memory and the hard disk drive, and an interface circuit which communicates externally, wherein the hard disk stores data, and the ferroelectric memory stores a flag indicating whether each track information or each sector information of the hard disk is used, and a flag indicating whether each track information or each sector information of the hard disk is unusable.

The 29th form of the present invention is a memory system characterized by comprising a ferroelectric memory formed by arranging a plurality of memory cells each comprising a ferroelectric capacitor and cell transistor, a hard disk drive which magnetically stores data, a control circuit which controls the ferroelectric memory and the hard disk drive, and an interface circuit which communicates externally, wherein when data write is designated from outside the memory system, a write end flag to the ferroelectric memory is written in the ferroelectric memory, and then a write end flag to the hard disk is written in the ferroelectric memory.

The 30th form of the present invention is a memory system characterized by comprising a ferroelectric memory formed by arranging a plurality of memory cells each comprising a ferroelectric capacitor and cell transistor, a hard disk drive which magnetically stores data, a control circuit which controls the ferroelectric memory and the hard disk drive, and an interface circuit which communicates externally, wherein data having the same logical address is permitted to be stored in the hard disk drive and ferroelectric memory, and the ferroelectric memory stores flag 1 indicating the permission of the storage, flag 2 information indicating whether the contents of data stored in the same logical address of the hard disk drive and ferroelectric memory are the same or different, information of the logical address, and a physical address to be stored in the hard disk.

Functions

According to an aspect of the present invention, a flash EEPROM having a large capacity but requiring a read start time, program time, and erase time is used as a data storage memory which requires a large memory area, and a ferroelectric memory having a small capacity but capable of high-speed read/write stores system information which requires only a small-capacity memory area but must be written in a large number of small-capacity locations whenever data is written. This system information for storing the data is root information, directory information, the file name of the data, the file size of the data, file allocation table information storing the storage location of the data, the write completion time of the data, or an assign table indicating the relationship between the physical address of the block position and page position where the data is actually stored in the flash EEPROM and the actual logical address. This makes it possible to practically largely reduce the write time of the system information, and greatly improve the performance of the entire OS system and the whole memory system. The effects of the present invention improve especially when a data file size to be read or written is small, because the storage amount of the system information is relatively large.

Also, the control circuit or ferroelectric memory stores information which defines areas of a logical address space which are to be stored in the flash EEPROM and ferroelectric memory. This allows free design of the system area, and high-speed processing of a file having a high read/write frequency even in a data area. As a consequence, the read/write performance of the entire system can be improved.

Furthermore, the flash EEPROM stores data, and the ferroelectric memory stores flag information indicating that actual recording of the data into the flash EEPROM is started, or flag information indicating that actual recording of the data into the flash EEPROM is completed. This improves the performance of the memory system.

In addition, the flash EEPROM stores data, and the ferroelectric memory stores a flag indicating whether each page or each block of the flash EEPROM is used, and a flag indicating whether each page or each block of the flash EEPROM is unusable. This increases the speeds of these storage operations, and improves the performance of the whole system.

Also, in a memory system comprising a ferroelectric memory formed by arranging a plurality of memory cells each comprising a ferroelectric capacitor and cell transistor, a flash EEPROM formed by arranging a plurality of memory cells each having a floating gate and capable of electrically erasing and writing data, a control circuit which controls the ferroelectric memory and flash EEPROM, and an interface circuit which communicates externally, wherein when data write is designated from the outside, a write start flag, write data, a write address, and a write end flag to the ferroelectric memory are written in the ferroelectric memory, and then the data is written in the flash EEPROM, and a write start flag, write data, a write address, and a write end flag to the flash EEPROM are written in the ferroelectric memory. Accordingly, when data write is designated from outside the memory system, the data is once written in the ferroelectric memory, and the data write is apparently completed when the memory system is viewed from the outside because a write end flag is ON. Even if an instantaneous power failure or card removal occurs while data is written in the flash EEPROM after that, the data need only be moved and copied from the ferroelectric memory to the flash EEPROM again when the power supply is turned on again.

Furthermore, data having the same logical address is permitted to be stored in the flash EEPROM and ferroelectric memory. The ferroelectric memory stores a first flag indicating the permission of the storage, second flag information indicating whether the contents of data stored in the same logical address of the flash EEPROM and ferroelectric memory are the same or different, information of the logical address, and a physical address to be stored in the flash EEPROM. Since read/write of data having a high read frequency is performed by accessing only the ferroelectric memory, the number of times of access to the flash EEPROM reduces. This increases the effective read/write bandwidth.

Moreover, a memory system is formed by a hard disk, flash EEPROM, and ferroelectric memory, system information is stored in the ferroelectric memory, and data is stored in the hard disk and flash EEPROM. Accordingly, the capacity of the memory system can be further increased while a high-speed operation is possible.

As has been explained in detail above, each embodiment of the present invention makes it possible to increase the speed of read/write of file system information of an OS or the like or system information of a card or the like when data is to be written, and to construct a low-cost, large-capacity memory system capable of high-speed data read/write.

As described above, according to one aspect of this invention, a memory system capable of high-speed read/write is obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A memory system comprising:
   a ferroelectric memory including a plurality of memory cells each including a ferroelectric capacitor and a cell transistor;
   a flash EEPROM including a plurality of memory cells each including a floating gate and configured to electrically erase and write data;
   a control circuit configured to control the ferroelectric memory and the flash EEPROM; and
   an interface circuit configured to communicate with an external point,
   wherein the ferroelectric memory includes a flag memory area in a part of the ferroelectric memory, and
   the flag memory area includes a first area that stores write-end flag data that indicates that actual recording of the data into the flash EEPROM is completed.

2. The system according to claim 1, wherein the flag memory area includes a second area that stores write-end flag data that indicates that actual recording of the data into the ferroelectric memory is completed.

3. The system according to claim 2, wherein the flag memory area includes a third area that stores write-begin flag data that indicates that actual recording of the data into the flash EEPROM is started.

4. The system according to claim 3, wherein the flag memory area includes a fourth area that stores write-begin flag data that indicates that actual recording of the data into the ferroelectric memory is started.

5. A memory system comprising:
   a ferroelectric memory including a plurality of memory cells each including a ferroelectric capacitor and a cell transistor;
   a flash EEPROM including a plurality of memory cells each including a floating gate and configured to electrically erase and write data;
   a control circuit configured to control the ferroelectric memory and the flash EEPROM; and
   an interface circuit configured to communicate with an external point,
   wherein the ferroelectric memory includes a flag memory area in a part of the ferroelectric memory,
   the flag memory area includes a first area that stores write-end flag data that indicates that actual recording of the data into the flash BEPROM is completed, and
   the flag memory area includes a second area that stores write-begin flag data that indicates that actual recording of the data into the flash EEPROM is started.

6. The system according to claim 5, wherein some parts of the ferroelectric memory store logical to physical converted map data indicating a relationship between a physical address of a block position and a page position where the data is actually stored in the flash EEPROM and an actual logical address.

7. A memory system comprising:
   a ferroelectric memory including a plurality of memory cells each including a ferroelectric capacitor and a cell transistor;

a flash EEPROM including a plurality of memory cells each including a floating gate and configured to electrically erase and write data;
a hard disk configured to magnetically store data;
a control circuit configured to control the ferroelectric memory, the flash EEPROM, and the hard disk; and
an interface circuit configured to communicate with an external point,
wherein the ferroelectric memory includes a mapping memory area in the ferroelectric memory.

8. The system according to claim 7, wherein the mapping memory area includes a first area that stores logical to physical converted map data indicating a relationship between a physical address of a block position and a page position where the data is actually stored in the flash EEPROM and an actual logical address.

9. The system according to claim 7, wherein the mapping memory area includes a first area that stores logical to physical converted map data indicating a relationship between a physical address of the hard-disk and an actual logical address.

10. A memory system comprising:
a ferroelectric memory including a plurality of memory cells including a ferroelectric capacitor and a cell transistor;
a flash EEPROM including a plurality of memory cells each including a floating gate and configured to electrically erase and write data;
a hard disk configured to magnetically store data;
a control circuit configured to control the ferroelectric memory, the flash EEPROM, and the hard disk; and
an interface circuit configured to communicate externally,
wherein the ferroelectric memory includes a flag memory area in a part of the ferroelectric memory,
the flag memory area includes a first area that stores write-end flag data that indicates that actual recording of the data into the flash EEPROM is completed, and
the flag memory area includes a second area that stores write-end flag data that indicates that actual recording of the data into the hard disk is completed.

11. A memory system comprising:
a ferroelectric memory including a plurality of memory cells each including a ferroelectric capacitor and a cell transistor;
a hard disk configured to magnetically store data;
a control circuit configured to control the ferroelectric memory and the hard disk; and
an interface circuit configured to communicate with an external point,
wherein the ferroelectric memory includes a mapping memory area in a part of the ferroelectric memory, and
the mapping memory area stores logical to physical converted map data indicating a relationship between a physical address on the hard disk and an actual logical address.

12. A memory system comprising:
a ferroelectric memory including a plurality of memory cells each including a ferroelectric capacitor and a cell transistor;
a hard disk configured to magnetically store data;
a control circuit configured to control the ferroelectric memory and the hard disk; and
an interface circuit configured to communicate with an external point,
wherein the ferroelectric memory includes a flag memory area in a part of the ferroelectric memory,
the flag memory area includes a first area that stores write-begin flag data that indicates that actual recording of the data into the hard disk is started, and
the flag memory area includes a second area that stores write-end flag data that indicates that actual recording of the data into the hard disk is completed.

* * * * *